US012648219B2

(12) United States Patent
Yu et al.

(10) Patent No.: US 12,648,219 B2
(45) Date of Patent: Jun. 2, 2026

(54) GATE ISOLATION FEATURES AND METHODS OF FABRICATING THE SAME IN SEMICONDUCTOR DEVICES

(71) Applicant: Taiwan Semiconductor Manufacturing Company, Ltd., Hsin-Chu (TW)

(72) Inventors: Chia-Ta Yu, New Taipei City (TW); Jiun-Ming Kuo, Taipei City (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 432 days.

(21) Appl. No.: 17/460,687

(22) Filed: Aug. 30, 2021

(65) Prior Publication Data
US 2023/0068568 A1 Mar. 2, 2023

(51) Int. Cl.
| *H10D 84/83* | (2025.01) |
| *H10D 30/01* | (2025.01) |
| *H10D 30/62* | (2025.01) |
| *H10D 62/10* | (2025.01) |

(52) U.S. Cl.
CPC ......... *H10D 84/834* (2025.01); *H10D 30/024* (2025.01); *H10D 30/6211* (2025.01); *H10D 30/6219* (2025.01); *H10D 62/115* (2025.01)

(58) Field of Classification Search
CPC ........... H01L 27/0886; H01L 29/41791; H01L 29/66795; H01L 29/66545; H01L 21/823481
See application file for complete search history.

(56) References Cited

U.S. PATENT DOCUMENTS

| 2020/0135587 A1* | 4/2020 | Cheng ............... H01L 21/02236 |
| 2020/0328208 A1* | 10/2020 | Chiang ............ H01L 29/66545 |
| 2020/0343377 A1* | 10/2020 | Chiang .................. H10D 30/62 |
| 2021/0134797 A1* | 5/2021 | Lin .................. H01L 21/823481 |
| 2021/0159311 A1* | 5/2021 | Lan ................... H01L 29/42376 |

* cited by examiner

*Primary Examiner* — Vu A Vu
*Assistant Examiner* — Valerie N Newton
(74) *Attorney, Agent, or Firm* — HAYNES AND BOONE, LLP

(57) ABSTRACT
A semiconductor structure includes fins protruding from a substrate and separated by a dielectric layer, each semiconductor fin including a plurality of semiconductor layers, source/drain (S/D) features disposed in the semiconductor fins, a first metal gate stack and a second metal gate stack disposed over the semiconductor fins and adjacent to the S/D features, where the first and the second metal gate stacks each include a top portion and a bottom portion disposed below the top portion, and where the bottom portion is interleaved with the semiconductor layers, and an isolation feature disposed on the dielectric layer and in contact with a sidewall surface of each of the first and the second metal gate stacks, where the isolation feature protrudes from the top portion of the first and the second metal gate stack, and where the isolation feature includes two compositionally different dielectric layers.

20 Claims, 31 Drawing Sheets

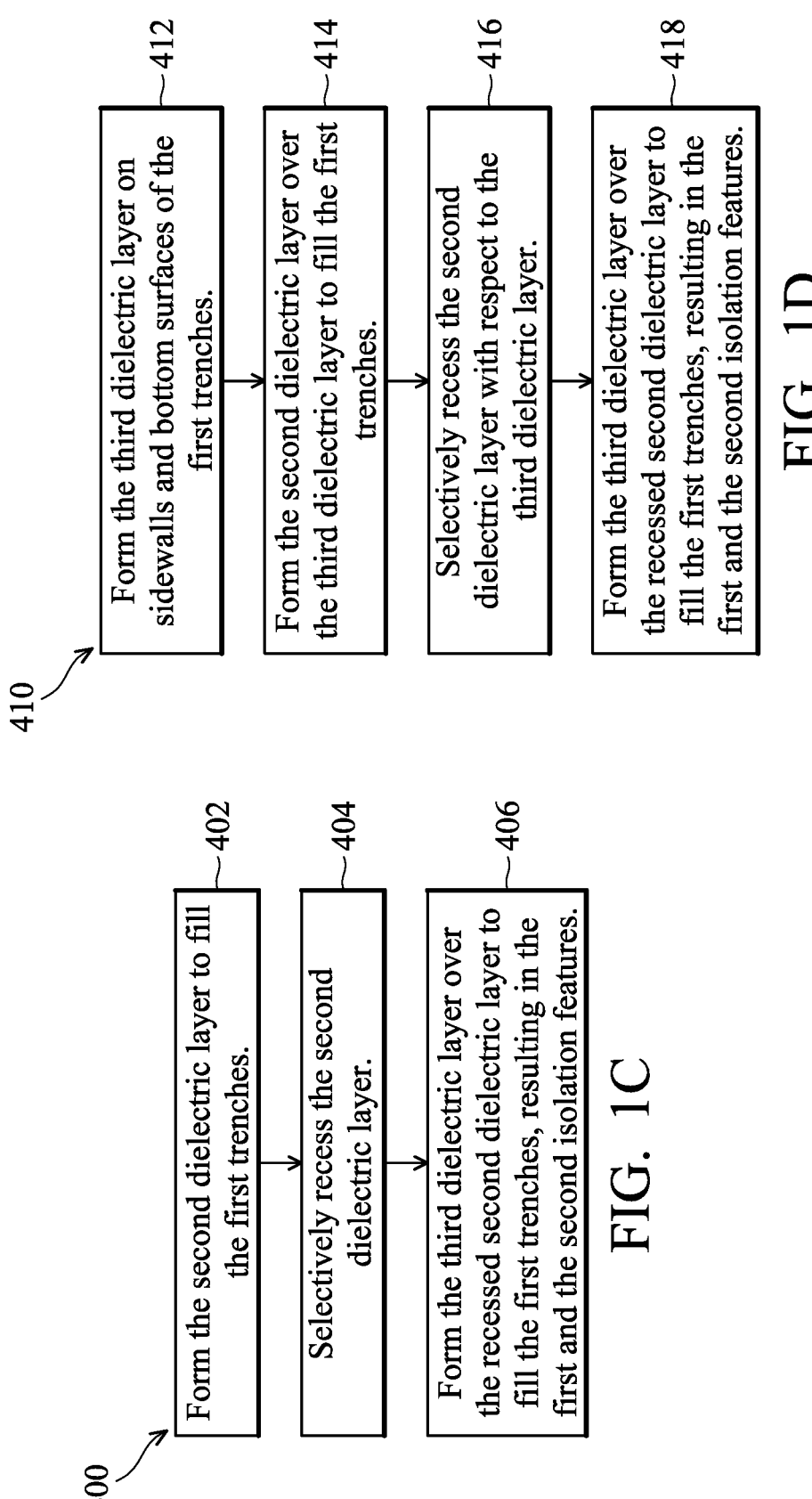

410

412 — Form the third dielectric layer on sidewalls and bottom surfaces of the first trenches.

414 — Form the second dielectric layer over the third dielectric layer to fill the first trenches.

416 — Selectively recess the second dielectric layer with respect to the third dielectric layer.

418 — Form the third dielectric layer over the recessed second dielectric layer to fill the first trenches, resulting in the first and the second isolation features.

402 — Form the second dielectric layer to fill the first trenches.

404 — Selectively recess the second dielectric layer.

406 — Form the third dielectric layer over the recessed second dielectric layer to fill the first trenches, resulting in the first and the second isolation features.

FIG. 1C

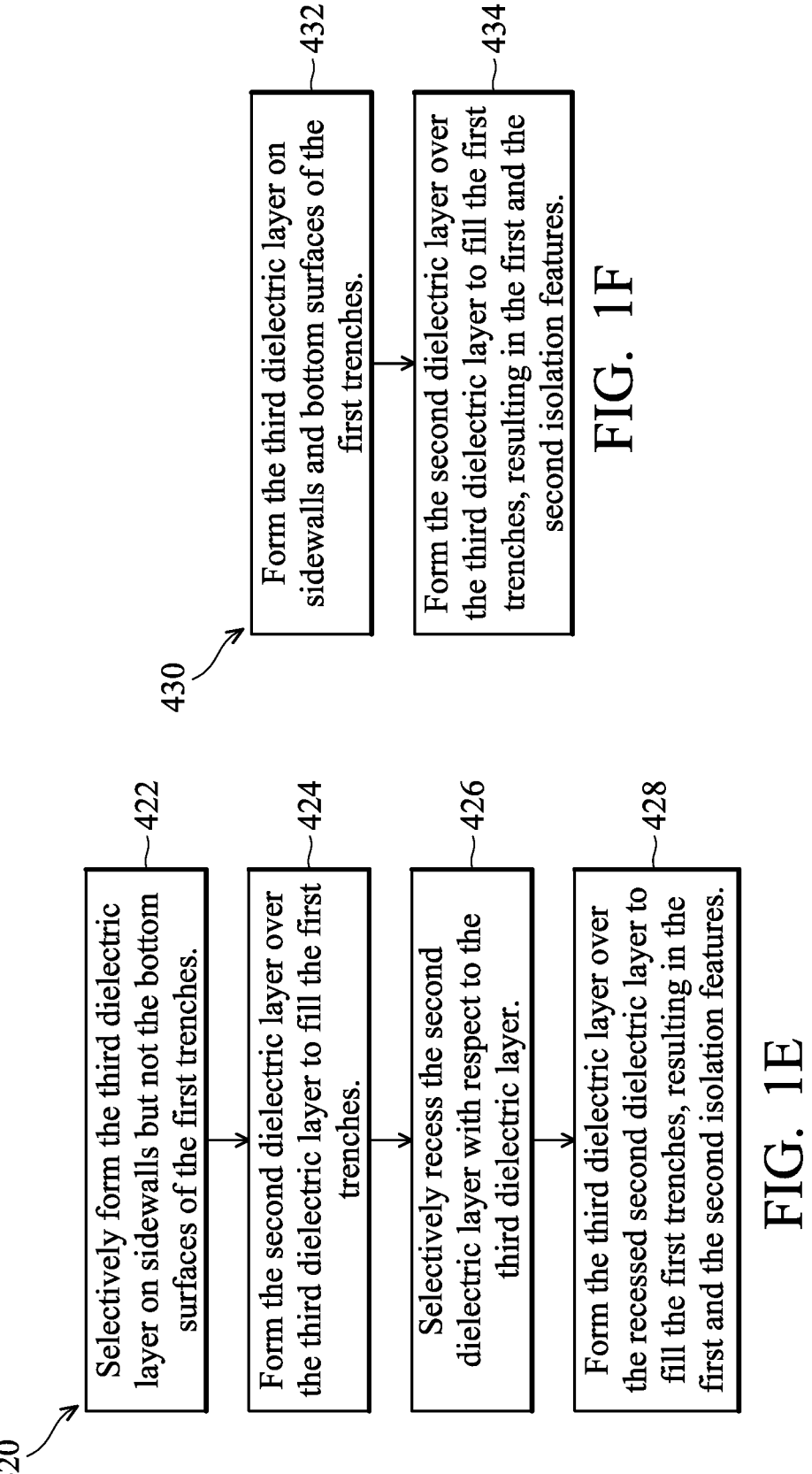

430

432 — Form the third dielectric layer on sidewalls and bottom surfaces of the first trenches.

434 — Form the second dielectric layer over the third dielectric layer to fill the first trenches, resulting in the first and the second isolation features.

422 — Selectively form the third dielectric layer on sidewalls but not the bottom surfaces of the first trenches.

424 — Form the second dielectric layer over the third dielectric layer to fill the first trenches.

426 — Selectively recess the second dielectric layer with respect to the third dielectric layer.

428 — Form the third dielectric layer over the recessed second dielectric layer to fill the first trenches, resulting in the first and the second isolation features.

FIG. 1E

GATE ISOLATION FEATURES AND METHODS OF FABRICATING THE SAME IN SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, parasitic capacitance of dielectric components disposed between active device regions may have serious bearings on the overall performance of an IC device. In some examples, high parasitic capacitance may lead to lower device speed (e.g., RC delays) when separation distances between the active device regions reduces to meet design requirements of smaller technology nodes. While methods of reducing parasitic capacitance in IC devices have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1C, 1D, 1E, and 1F each illustrate a flowchart of an example method for fabricating a portion of a semiconductor device according to various embodiments of the present disclosure.

DETAILED DESCRIPTION

Figure 1A:
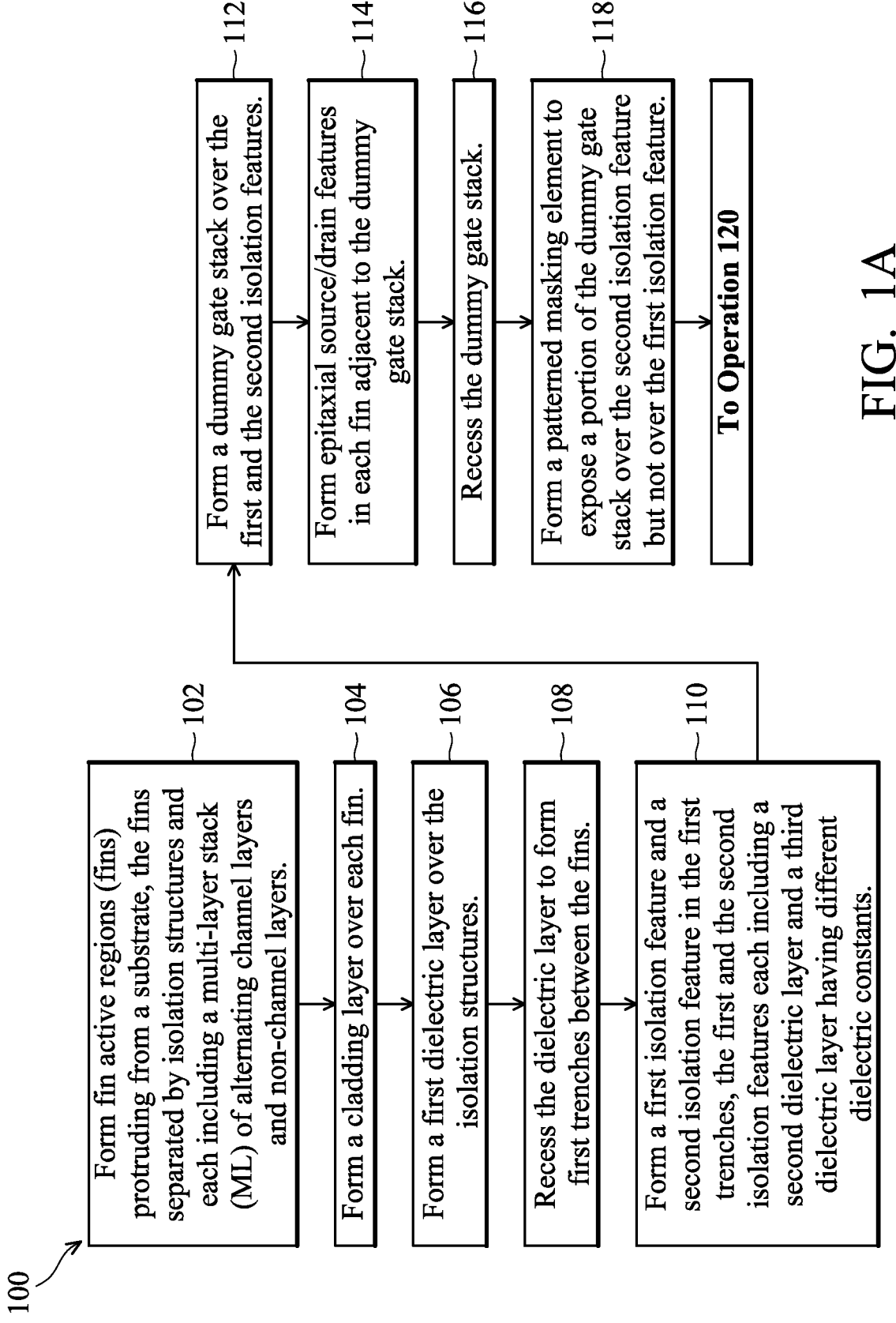
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA, FETs), in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. The present disclosure includes multiple embodiments. Different embodiments may have different advantages, and no particular advantage is necessarily required of any embodiment.

Figure 1B:
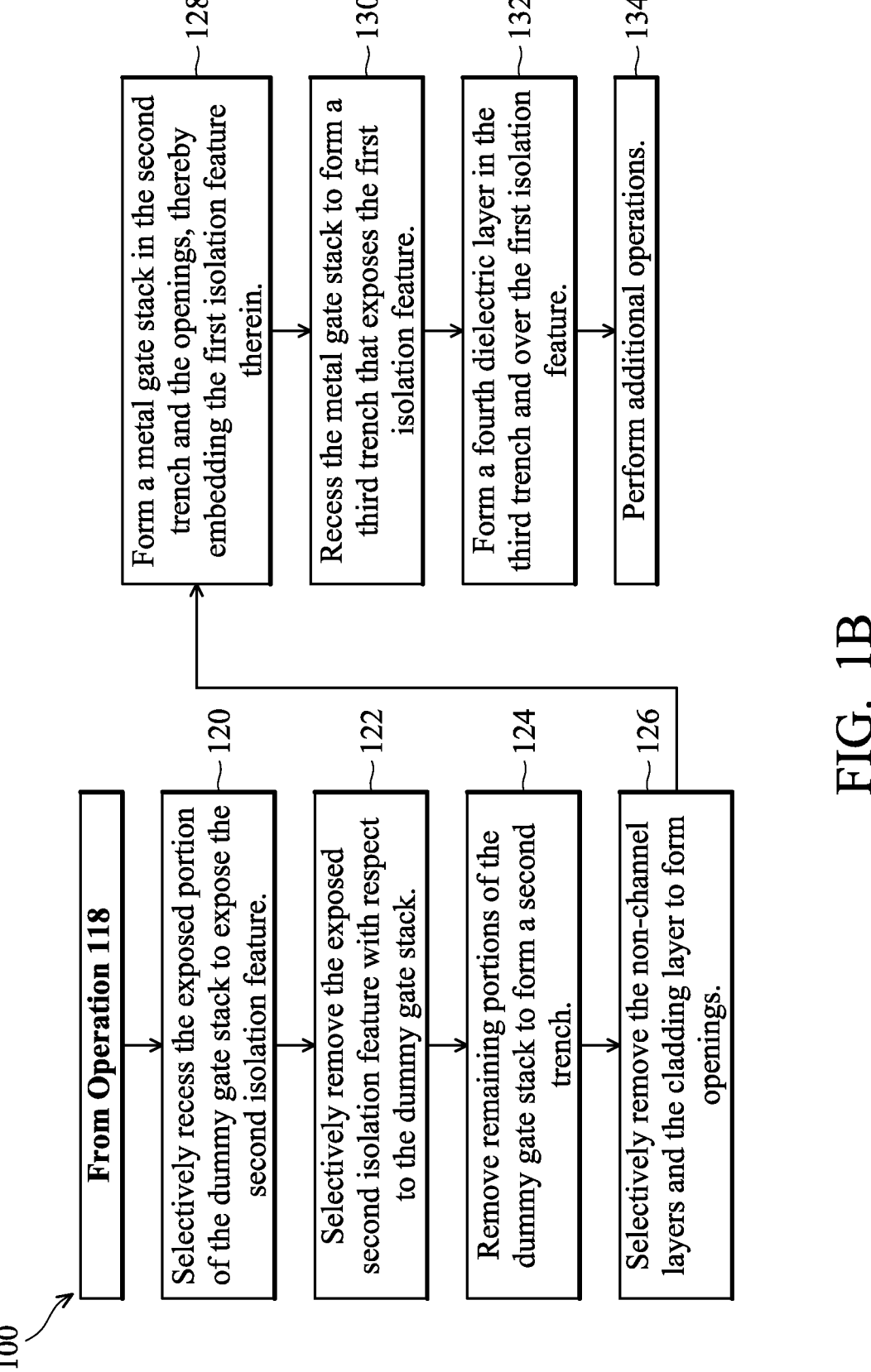
Figures 2A, 2B:
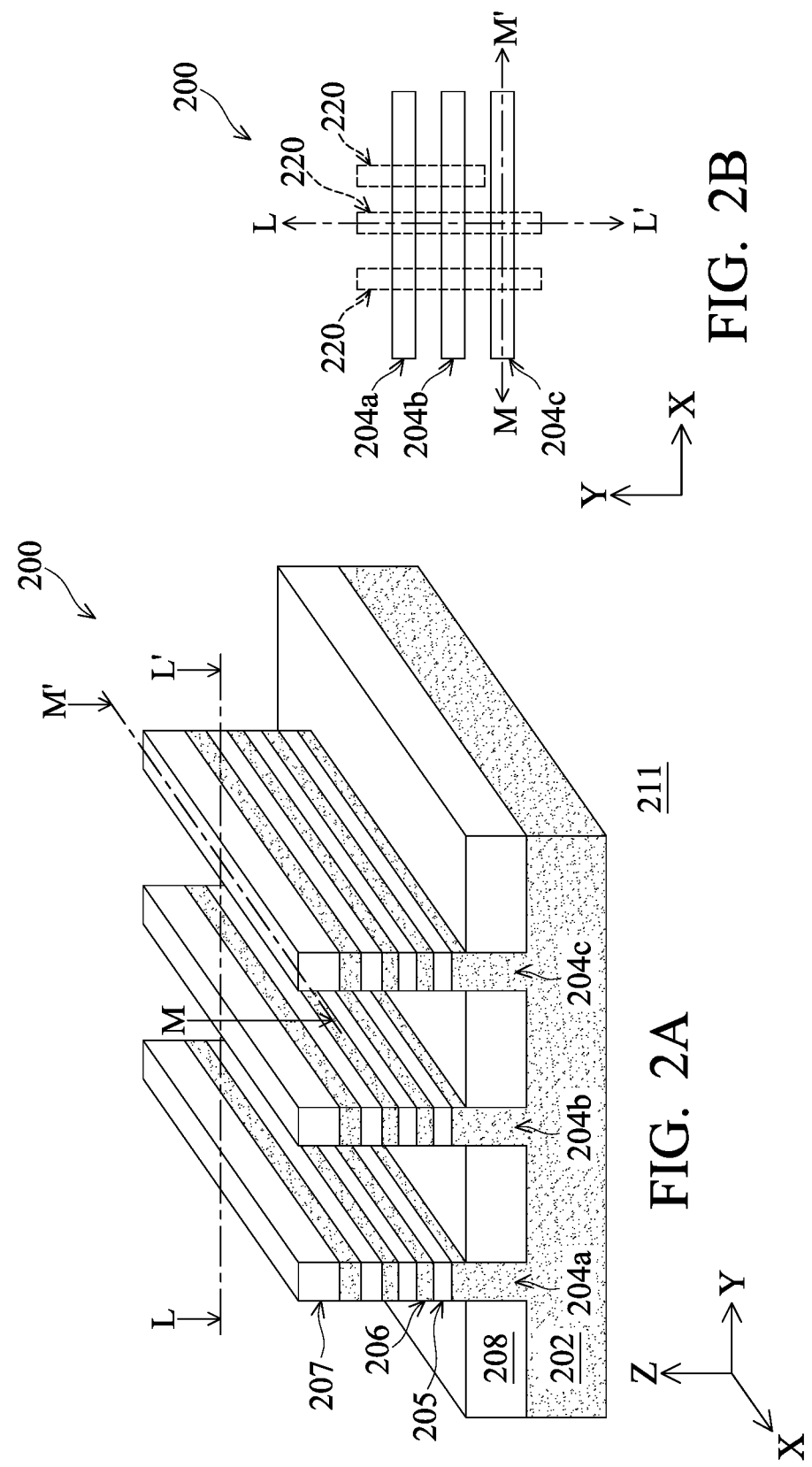
FIG. 2A is a three-dimensional perspective view of a portion of an example semiconductor device according to various embodiments of the present disclosure.
FIG. 2B is a planar top view of the semiconductor device shown in FIG. 2A according to various embodiments of the present disclosure.

Referring now to FIGS. 1A and 1B collectively, a flowchart of a method 100 of forming a semiconductor device 200 (hereafter simply referred to as the device 200) is illustrated according to various aspects of the present disclosure. FIGS. 1C-1F illustrate a flowchart of a method 400, a method 410, a method 420, and a method 430, respectively, of forming a portion of the semiconductor device 200 according to various aspects of the present disclosure. Methods 100, 400, 410, 420, and 430 are merely examples and are not intended to limit the present disclosure beyond what is explicitly recited in the claims. Additional operations can be provided before, during, and after methods 100, 400, 410, 420, and 430, and some operations described can be replaced, eliminated, or moved around for additional embodiments of the method. Methods 100, 400, 410, 420, and 430 are described below in conjunction with FIGS. 3A-22D, which are various cross-sectional and top planar views of the device 200 as shown in FIGS. 2A and 2B at intermediate steps of method 100. For examples, FIGS. 3A, 4A, 5A, 6A, 7A, 8A, 9A-1, 9A-2, 9A-3, 9B-1, 9B-2, 9B-3, 9B-4, 9C-1, 9C-2, 9C-3, 9C-4, 9C-5, 9D-1, 9D-2, 10A, 11A, 12A, 13A, 14A, 15A, 16A, 17A, 18A, 19A, 20A, 21A, 22A, 22B, 22C, and 22D are cross-sectional views of the device 200 taken along line LL' as shown in FIGS. 2A and/or 2B; FIGS. FIGS. 3B, 4B, 5B, 6B, 7B, 8B, 10B, 11B, 12B, 13B, 14B, 15B, 16B, 17B, 18B, 19B, 20B, and 21B are cross-sectional views of the device 200 taken along line MM' as shown in FIGS. 2A and/or 2B; and FIGS. 6C, 8C, 11C, 14C, 15C, 16C, 17C, 18C, 19C, 20C, and 21C are planar top views of the device 200 as shown in FIGS. 2A and/or 2B.

The device 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the device 200 includes one or more NS FETs. The present disclosure is not limited to any particular number of devices or device regions, or to any particular device configurations. Additional features can be added to the device 200, and some of the features described below can be replaced, modified, or eliminated in other embodiments of the device 200.

At operation 102, referring to FIGS. 2A-3B, method 100 forms the device 200 that includes multiple active three-dimensional device regions (hereafter referred to as fins) 204a, 204b, and 204c protruding from a semiconductor substrate (hereafter referred to as the substrate) 202, where the fins 204a-204c are separated by isolation features 208.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

Figure 3B:
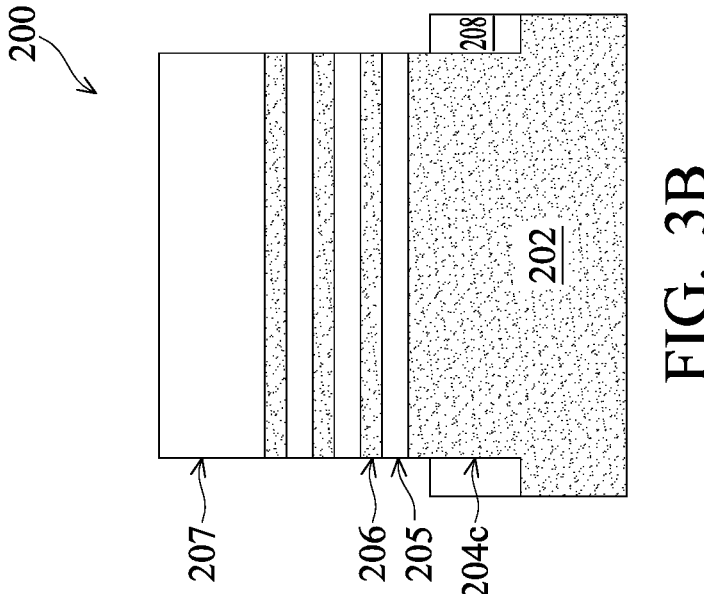
FIGS. 3B, 4B, 5B, 6B, 7B, 8B, 10B, 11B, 12B, 13B, 14B, 15B, 16B, 17B, 18B, 19B, 20B, and 21B are cross-sectional views of the semiconductor device taken along line MM' as shown in FIGS. 2A and/or 2B during intermediate stages of the method shown in FIGS. 1A, 1B, 1C, 1D, 1E, and/or 1F according to various embodiments of the present disclosure.
Figure 3A:
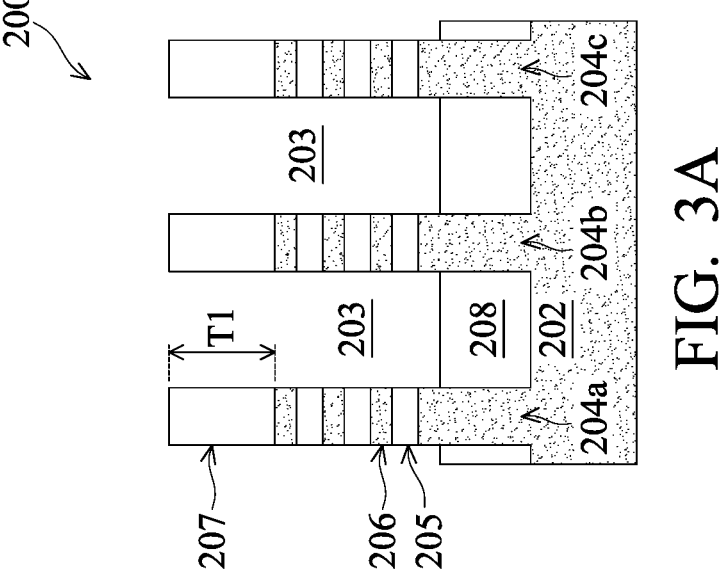
FIGS. 3A, 4A, 5A, 6A, 7A, 8A, 9A-1, 9A-2, 9A-3, 9B-1, 9B-2, 9B-3, 9B-4, 9C-1, 9C-2, 9C-3, 9C-4, 9C-5, 9D-1, 9D-2, 10A, 11A, 12A, 13A, 14A, 15A, 16A, 17A, 18A, 19A, 20A, 21A, 22A, 22B, 22C, and 22D are cross-sectional views of the semiconductor device taken along line LL' as shown in FIGS. 2A and/or 2B during intermediate stages of the method shown in FIGS. 1A, 1B, 1C, 1D, 1E, and/or 1F according to various embodiments of the present disclosure.
Figure 4B:
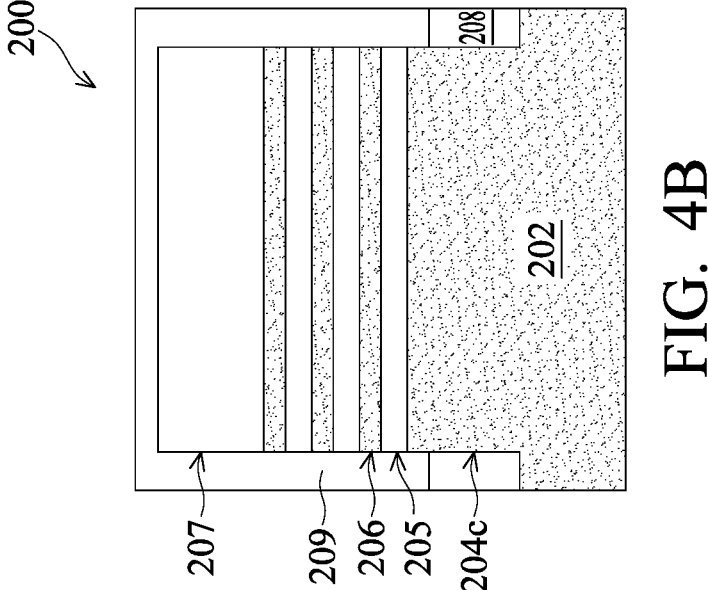
Figure 4A:
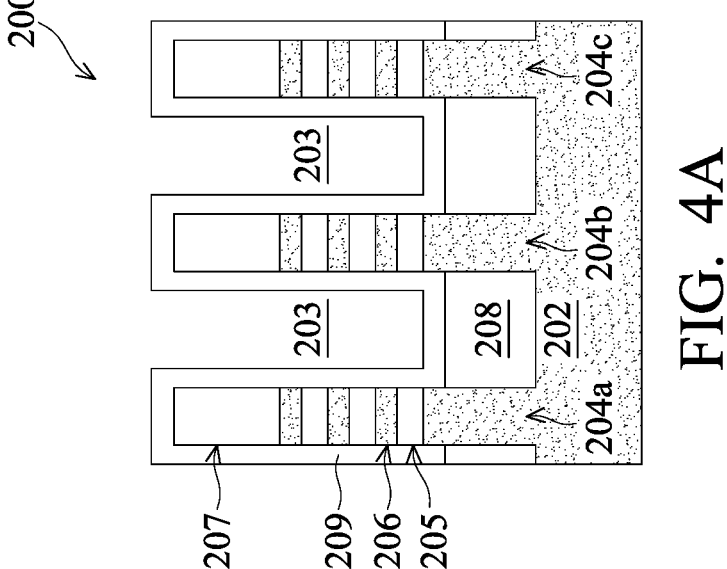
Figure 5B:
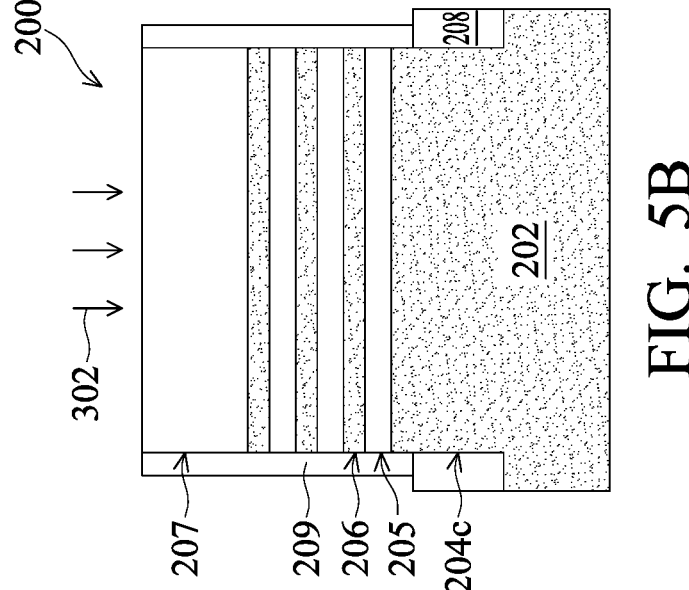
Figure 5A:
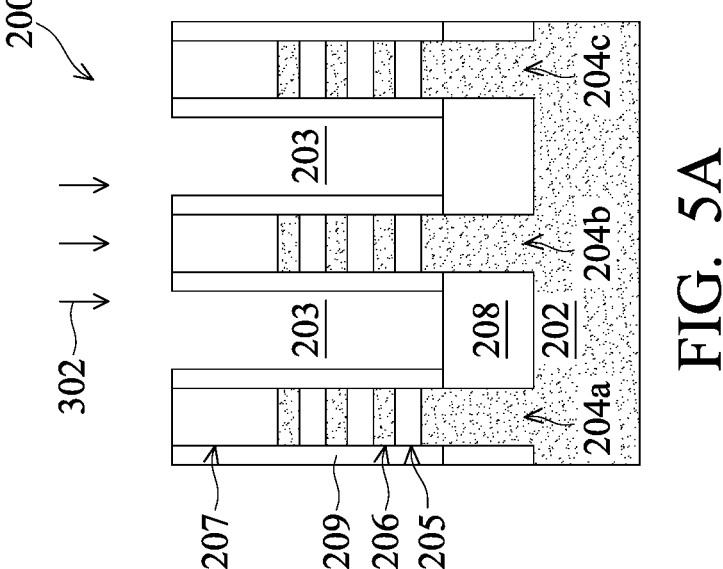

In the present embodiments, referring to FIGS. 2A and 3A, each fin 204a-204c includes a multi-layer structure (ML) of alternating non-channel layers (or sacrificial layers) 205 and channel layers 206 stacked vertically over protruding portions of the substrate 202, as well as a hard mask layer 207 over the ML. In the present embodiments, the non-channel layers 205 are sacrificial layers configured to be removed at a subsequent processing step, thereby providing openings between the channel layers 206 for forming metal gate stacks therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each fin 204a-204c may include a total of three to ten pairs of alternating non-channel layers 205 and channel layers 206; of course, other configurations may also be applicable depending upon specific design requirements.

In the present embodiments, the hard mask layer 207 is also a sacrificial layer configured to facilitate the formation of a gate isolation feature (discussed in detail below) and subsequently be removed from the device 200. As such, the thickness T1 of the hard mask layer 207 is adjusted based on the desired thickness of the gate isolation feature. In some embodiments, the thickness T1 is greater than a thickness of the non-channel layers 205 and the channel layers 206. The hard mask layer 207 may include any suitable material, such as a semiconductor material, so long as its composition is distinct from that of the gate isolation feature and the channel layer 206 disposed thereunder to allow selective removal by an etching process. In some embodiments, the hard mask layer 207 has a composition similar to or the same as that of the non-channel layers 205 and includes, for example, SiGe.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET. For embodiments in which the hard mask layer 207 has the same composition as the non-channel layers 205, the hard mask layer 207 is also grown by a similar epitaxy process as discussed herein.

In the present embodiments, the fins 204a-204c are fabricated from the ML (and the hard mask layer 207 disposed thereover) using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving three-dimensional fins 204a-204c protruding the substrate 202. The etching process may include dry etching, wet etching, reactive ion etching (RIE), other suitable processes, or combinations thereof. The patterned masking element is subsequently removed from the ML using any suitable process, such as ashing and/or resist stripping.

The isolation features 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation features 208 may include shallow trench isolation (STI) features. In one embodiment, the isolation features 208 are formed by filling trenches that separate the fins 204a-204c with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. The isolation features 208 may include a single-layer structure or a multi-layer structure. As depicted herein, the fins 204a-204c are separated by trenches 203, whose bottom surfaces are defined by the isolation features 208.

At operation 104, referring to FIGS. 4A-5B, method 100 forms a cladding layer 209 over the fins 204a-204c and the isolation features 208. In the present embodiments, the cladding layer 209 and the non-channel layers 205 are sacrificial layers configured to be replaced with a metal gate stack in a channel region of the fin 204a-204c. In this regard, the cladding layer 209 has a composition substantially the same as that of the channel layers 205, such that they may be selectively removed by a common etching process. In the present embodiments, the cladding layer 209 includes SiGe. In some embodiments, the cladding layer 209 is deposited epitaxially by a suitable method discussed above with respect to forming the ML. In some embodiments, referring to FIGS. 4A and 4B, the cladding layer 209 is deposited conformally, rather than grown epitaxially, over surfaces of the device 200 as an amorphous layer, such that the cladding layer 209 is also formed over the isolation features 208. In the present embodiments, portions of the cladding layer 209 partially fill the trenches 203. In some examples, the cladding layer 209 may be formed to a thickness of about 5 nm to about 10 nm. Subsequently, referring to FIGS. 5A and 5B, method 100 performs an etching process 302 to selectively remove portions of the cladding layer 209, thereby exposing portions of the isolation features 208 and a top surface of the hard mask layer 207. Accordingly, the etching process 302 re-exposes portions of the isolation features 208 in the trenches 203. The etching process 302 may include a dry etching process, a wet etching process, an RIE process, or combinations thereof. The etching process 302 may implement an etchant that selectively removes horizontal portions of the cladding layer 209 without removing, or substantially removing the isolation features 208 or vertical portions of the cladding layer 209.

Figures 6A, 6B, 6C:
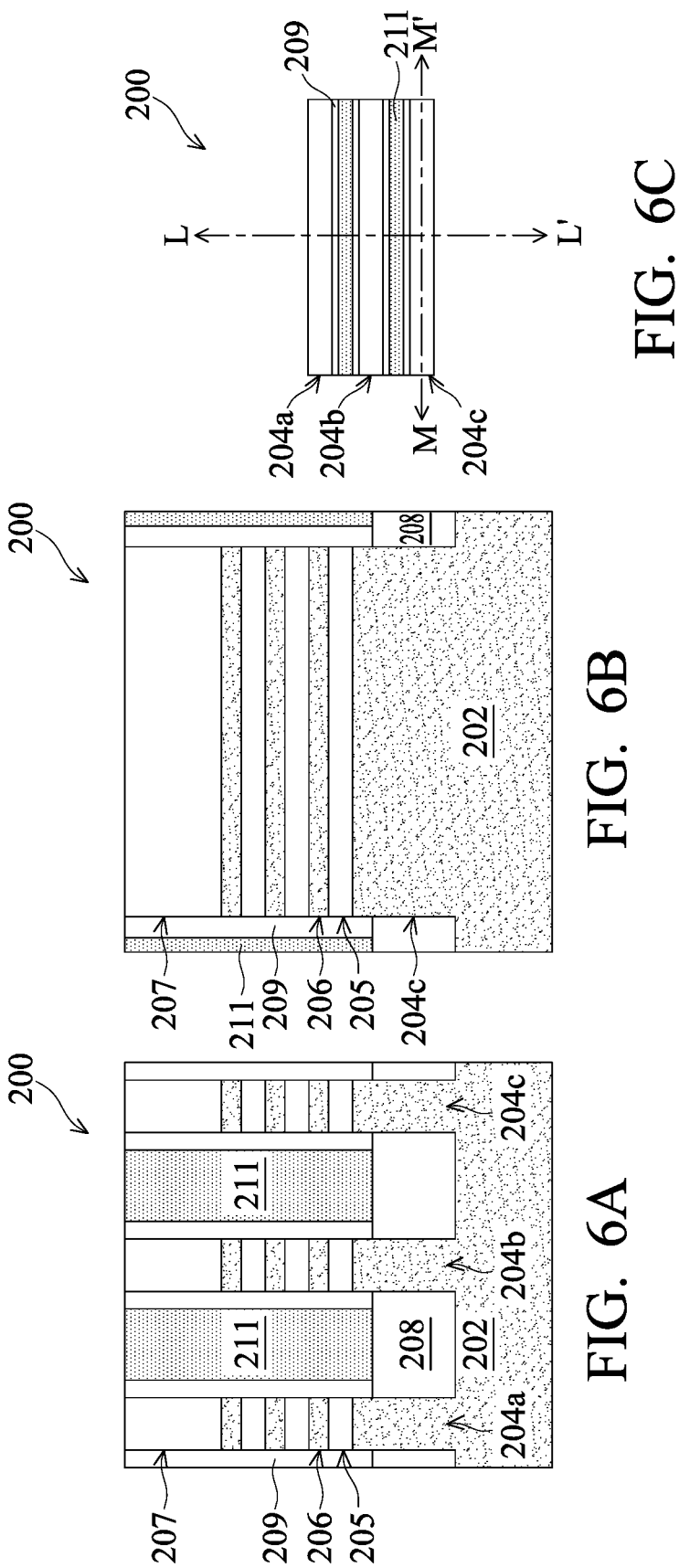
FIGS. 6C, 8C, 11C, 14C, 15C, 16C, 17C, 18C, 19C, 20C, and 21C are planar top views of the semiconductor device as shown in FIGS. 2A and/or 2B during intermediate stages of the method shown in FIGS. 1A, 1B, 1C, 1D, 1E, and/or 1F according to various embodiments of the present disclosure.

At operation 106, referring to FIGS. 6A-6C, method 100 forms a dielectric layer 211 over the device 200, thereby completely filling the trenches 203. The dielectric layer 211 is configured to isolate adjacent fins 204a-204c and to provide a substrate over which isolation features (e.g., isolation features 214a and 214b discussed in detail below) may be formed before forming any gate stacks. The dielectric layer 211 may include any suitable material, such as silicon oxide (SiO and/or $SiO_2$), FSG, a low-k dielectric material, other suitable materials, or combinations thereof. In some embodiments, the dielectric layer 211 has a composition similar to or the same as that of the isolation features 208. The dielectric layer 211 may be deposited by any suitable method, such as CVD, FCVD, SOG, other suitable methods, or combinations thereof, and subsequently planarized by one or more CMP process to expose a top surface of the hard mask layer 207. As depicted herein, the dielectric layer 211 is separated from each sidewall of the fins 204a-204c by a portion of the cladding layer 209.

Figure 7B:
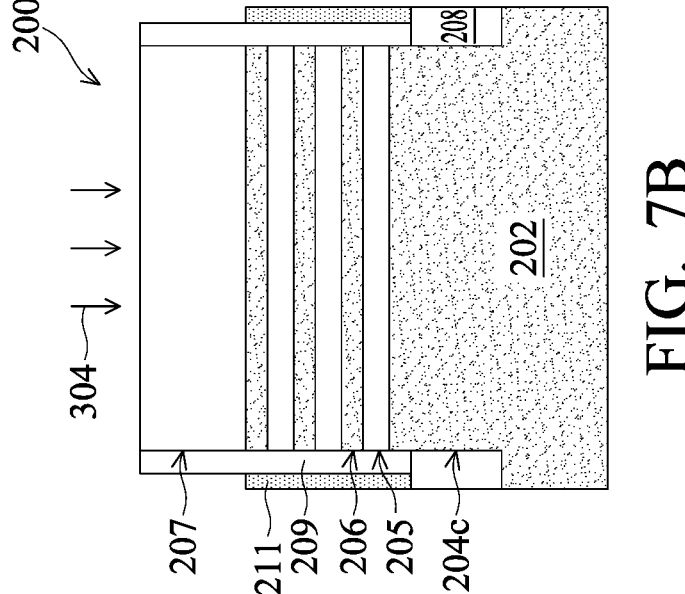
Figure 7A:
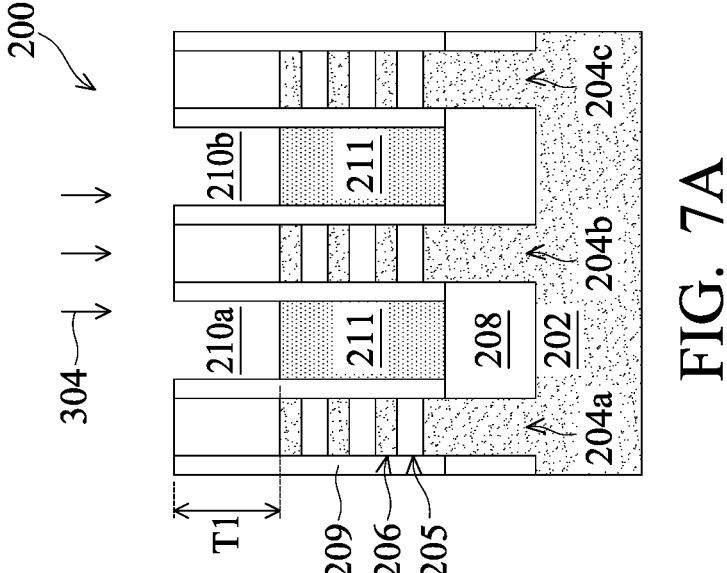

At operation 108, referring to FIGS. 7A and 7B, method 100 recesses a top portion of the dielectric layer 211 in an etching process 304, such that a top surface of the recessed dielectric layer 211 is substantially co-planar with the topmost channel layer 206. In other words, the resulting trench 210a (between the fins 204a and 204b) and trench 210b (between the fins 204b and 204c) formed over the recessed dielectric layer 211 each have a depth corresponding to the thickness T1. The etching process 304 may include any suitable process, such as a dry etching process, a wet etching process, an RIE process, other suitable processes, or combinations thereof. In some embodiments, the etching process 304 is similar to the etching back process applied to the isolation features 208.

Figures 8A, 8B, 8C:
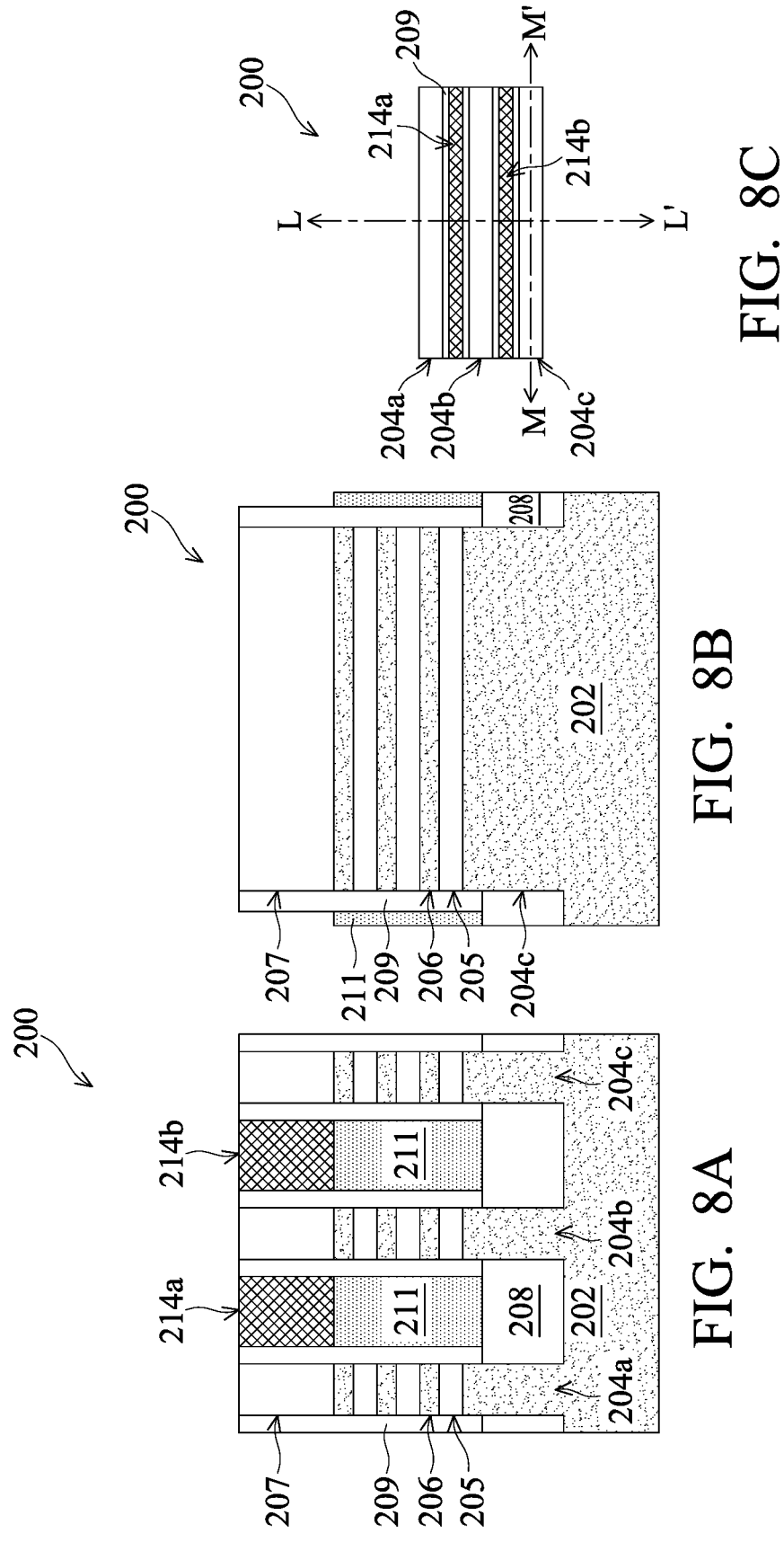

At operation 110, referring to FIGS. 8A-8C, method 100 forms isolation features 214a and 214b in the trenches 210a and 210b, respectively, thereby filling the space between the fins 204a-204c. In the present embodiments, one or both of the isolation features 214a and 214b is configured to provide isolation for a subsequently-formed metal gate stack over the fins 204a-204c. In other words, one or both of the isolation features 214a and 214b are configured to truncate a metal gate stack, which is formed at a subsequent processing step, into multiple portions. If only one of the isolation features 214a and 214b remains in the device 200 to provide isolation for the metal gate stack, as is the case in the depicted embodiments, the other one of the isolation features 214a and 214b is removed (by etching, for example) before forming the metal gate stack. The remaining isolation feature is referred to as a gate isolation feature (or a gate cut feature) that is self-aligned with the underlying dielectric layer 211 and between adjacent fins 204a-204c. In the present embodiments, the isolation features 214a and 214b are formed to have the same multi-layer structure, each comprising different dielectric materials. Furthermore, referring to FIG. 8C, the isolation features 214a and 214b are oriented lengthwise parallel to the lengthwise direction of the fins 204a-204c and are separated from the sidewalls of the fins 204a-204c by portions of the cladding layer 209.

Collectively referring to FIGS. 9A-3, 9B-4, 9C-5, and 9D-2, in the present embodiments, the isolation features 214a and 214b each include a dielectric layer 212 and a dielectric layer 213, where the dielectric constant (k value) of the dielectric layer 213 is greater than that of the dielectric layer 212. In this regard, the overall capacitance of the isolation feature 214a (or 214b) depends upon the relative amounts of the dielectric layer 212 and 213. For example, increasing the volume of the dielectric layer 212 relative to the volume of the dielectric layer 213 decreases the overall capacitance of the isolation feature 214a (or 214b), and decreasing the volume of the dielectric layer 212 relative to the volume of the dielectric layer 213 increases the overall capacitance of the isolation feature 214a (or 214b). In the present embodiments, the dielectric layer 213 is included to protect sidewall and/or top surfaces of the dielectric layer 212 against potential etching damage during a subsequent fabrication process (e.g., a metal gate replacement process, a metal gate recess process, and/or other processes). Accordingly, to lower the overall capacitance (i.e., the parasitic capacitance) of the isolation features 214a and 214b, the volume of the dielectric layer 212 is configured to be more than that of the dielectric layer 213. In some embodiments, the volume of the dielectric layer 212 is at least about 50% of the volume of the trench 210a or 210b as depicted in FIG.

7A. The present embodiments do not limit the volume of the dielectric layer 212 to any specific value, so long as the isolation features 214a and 214b each also include the dielectric layer 213. As will be discussed in detail below, a portion of the dielectric layer 213 present in each of the isolation features 214a and 214b may be sacrificially consumed during one or more of the subsequent etching process to protect the dielectric layer 212.

In the present embodiments, the dielectric layers 212 and 213 each include silicon oxide (SiO and/or $SiO_2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), air, a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. In one example, the dielectric layer 212 may include SiN and the dielectric layer 213 may include $HfO_2$. In another example, the dielectric layer 212 may include air (i.e., the dielectric layer 212 is an air gap) and the dielectric layer 213 may include SiN. In yet another example, the dielectric layer 212 may include silicon oxide, and the dielectric layer 213 may include SiN. Of course, the present embodiments are not limited to these compositions, so long as the dielectric constant of the dielectric layer 213 is greater than that of the dielectric layer 212. Furthermore, in some embodiments, the dielectric layer 213 has a higher density than the dielectric layer 212.

Generally, parasitic capacitance of dielectric components disposed between active regions or components plays an important role in boosting device performance. For gate isolation features (or gate cut features) designed to separate metal gate stacks into desired lengths, dielectric materials with higher k values (or dielectric constants) are utilized to accommodate aspects of subsequent fabrication process such as, for example, providing better etching resistance and structural integrity (e.g., higher density). While such design choices have been generally adequate, they are not entirely satisfactory in all aspects. For example, RC delay resulting in lower processing speed may occur with higher parasitic capacitance brought about by dielectric components with higher k values.

The present embodiments are directed to methods of forming gate isolation features having reduced parasitic capacitance without compromising other aspects of the design requirements, such as etching resistance and structural integrity. Additionally, because they are formed between adjacent fin active regions (e.g., the fins 204a-204c) and before performing metal gate replacement process, the gate isolation features may be configured to prevent inadvertent merging of epitaxial source/drain (S/D) features. Furthermore, the gate isolation features may also provide self-alignment capability for subsequent fabrication processes, such as forming S/D contacts over the epitaxial S/D features.

Figures 1, 2, 3, 9A:
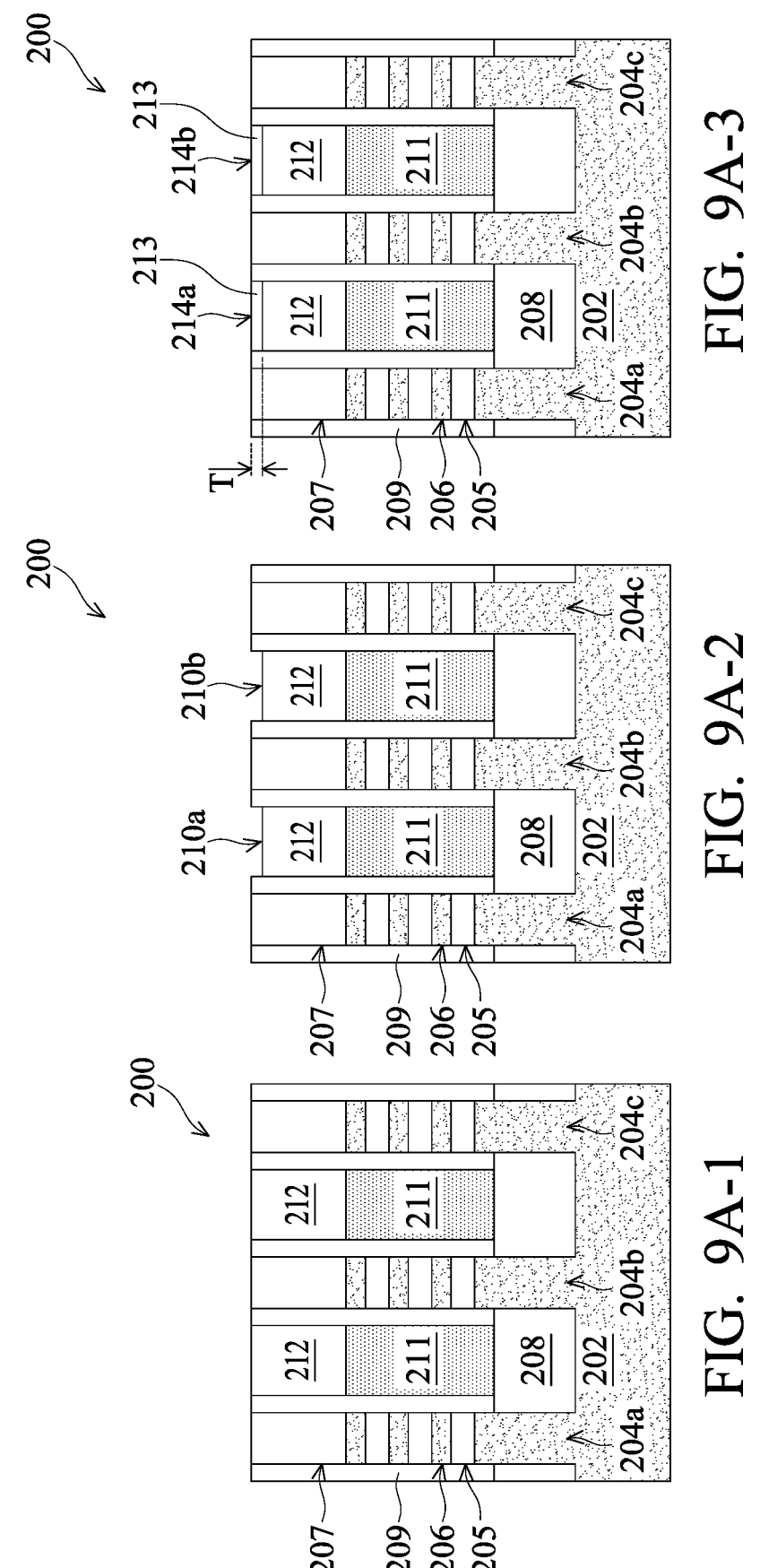

The dielectric layers 212 and 213 may be arranged in various configurations and formed in different processes. In some embodiments, referring to FIGS. 1C and 9A-1, method 400 at operation 402 deposits the dielectric layer 212 in the trenches 210a by a suitable process, such as CVD, FCVD, other suitable methods, or combinations thereof, and performs a CMP process to planarize the device 200. Referring to FIG. 9A-2, method 100 at operation 404 selectively recesses the dielectric layer 212 with respect to its surrounding components in a suitable etching method, such as a dry etching process, to re-expose portions of the trenches 210a and 210b. Thereafter, referring to FIG. 9A-3, method 100 at operation 406 deposits the dielectric layer 213 over the recessed dielectric layer 212 and performs a CMP process to planarize the device 200, thereby forming the isolation features 214a and 214b. Accordingly, the dielectric layer 213 is formed over a top surface of the dielectric layer 212 and serves as a hard mask layer for protection against subsequent etching processes.

Figures 2, 9B:
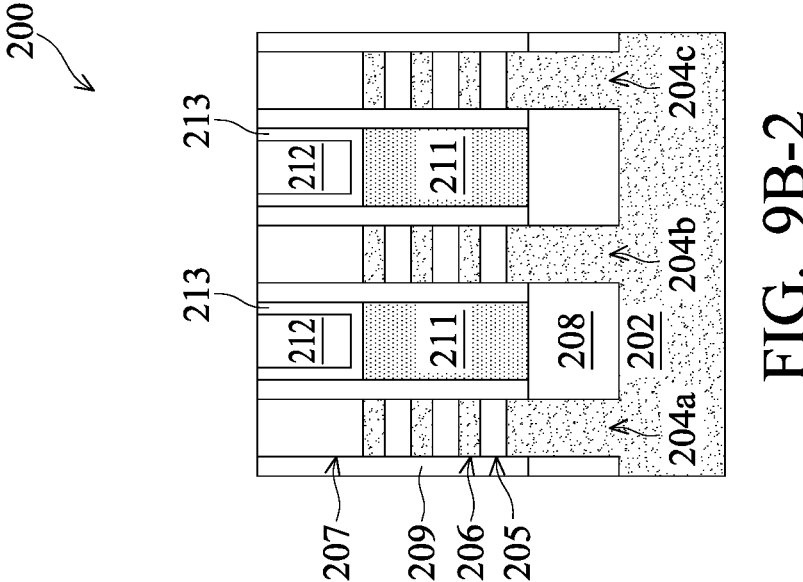
Figures 1, 9B:
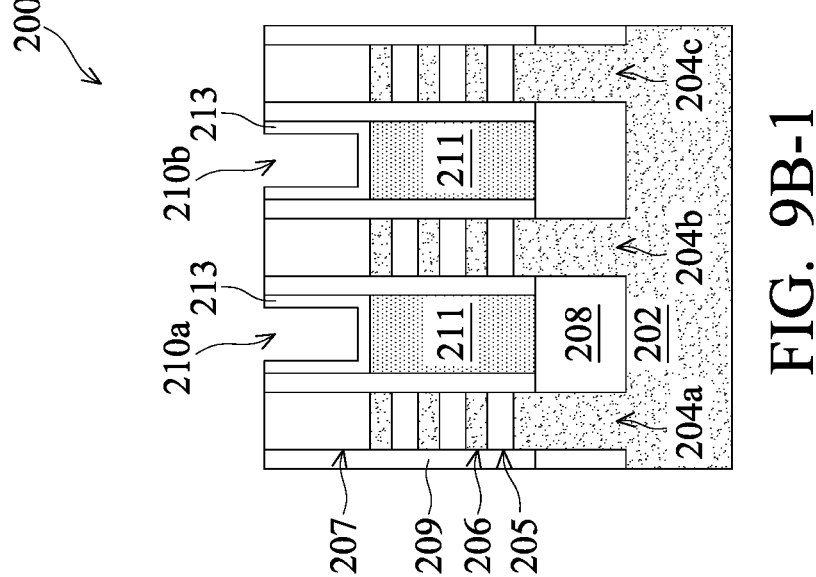
Figures 4, 9B:
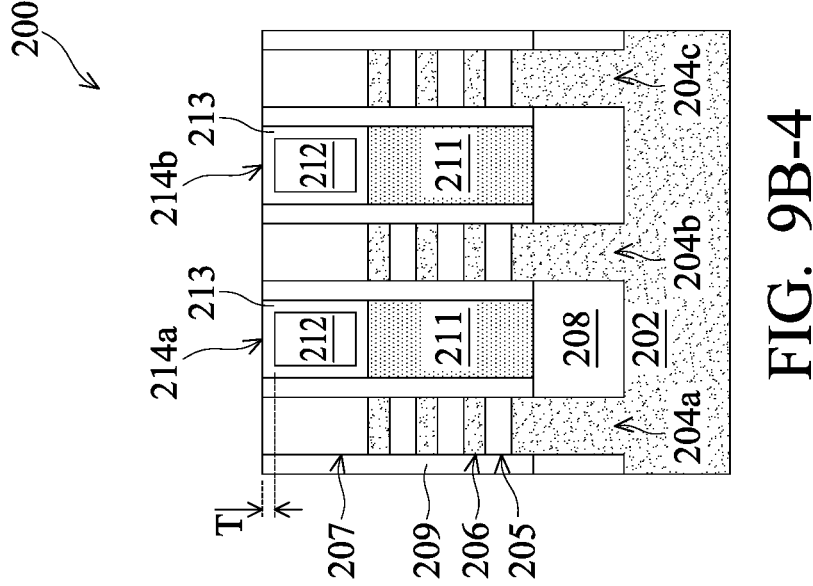
Figures 3, 9B:
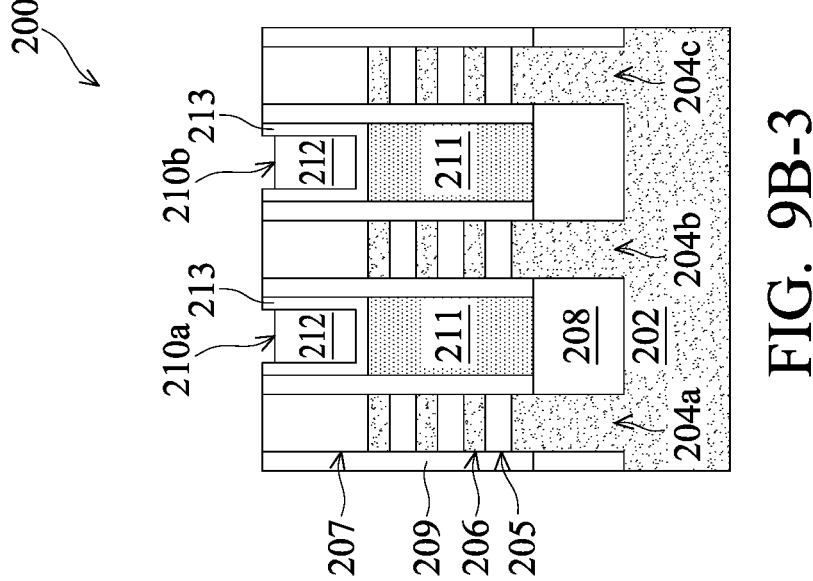

In some embodiments, referring to FIGS. 1D and 9B-1, method 410 at operation 412 conformally deposits the dielectric layer 213 on sidewalls and the bottom surfaces of the trenches 210a and 210b by a suitable method, such as atomic layer deposition (ALD), and performs a CMP process to remove portions of the dielectric layer 213 formed over the hard mask layer 207. Referring to FIG. 9B-2, method 410 at operation 414 fills the trenches 210a and 210b with the dielectric layer 212, followed by performing another CMP process to planarize the device 200. Subsequently, referring to FIG. 9B-3, method 410 at operation 416 selectively removes portions of the dielectric layer 212 with respect to the dielectric layer 213, thereby re-exposing the trenches 210a and 210b. Referring to FIG. 9B-4, method 410 at operation 418 deposits the dielectric layer 213 over the recessed dielectric layer 212 to fill the trenches 210a and 210b. Method 410 may further perform a CMP process to expose the hard mask layer 207, thereby forming the isolation features 214a and 214b. Accordingly, the dielectric layer 212 is fully (i.e., on all sides) encapsulated in, or surrounded by, the dielectric layer 213. In this regard, the dielectric layer 213 may offer improved protection for the dielectric layer 212 against the subsequent etching processes.

Figures 2, 9C:
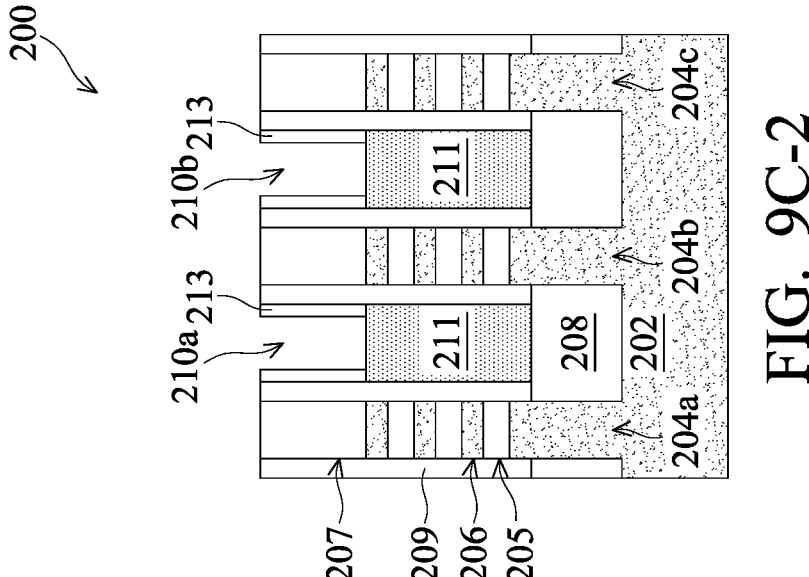
Figures 1, 9C:
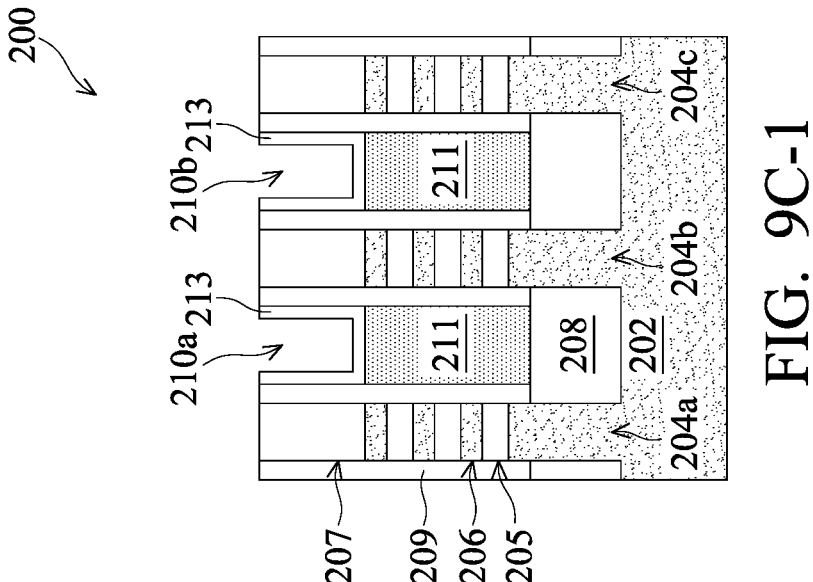
Figures 3, 4, 5, 9C:
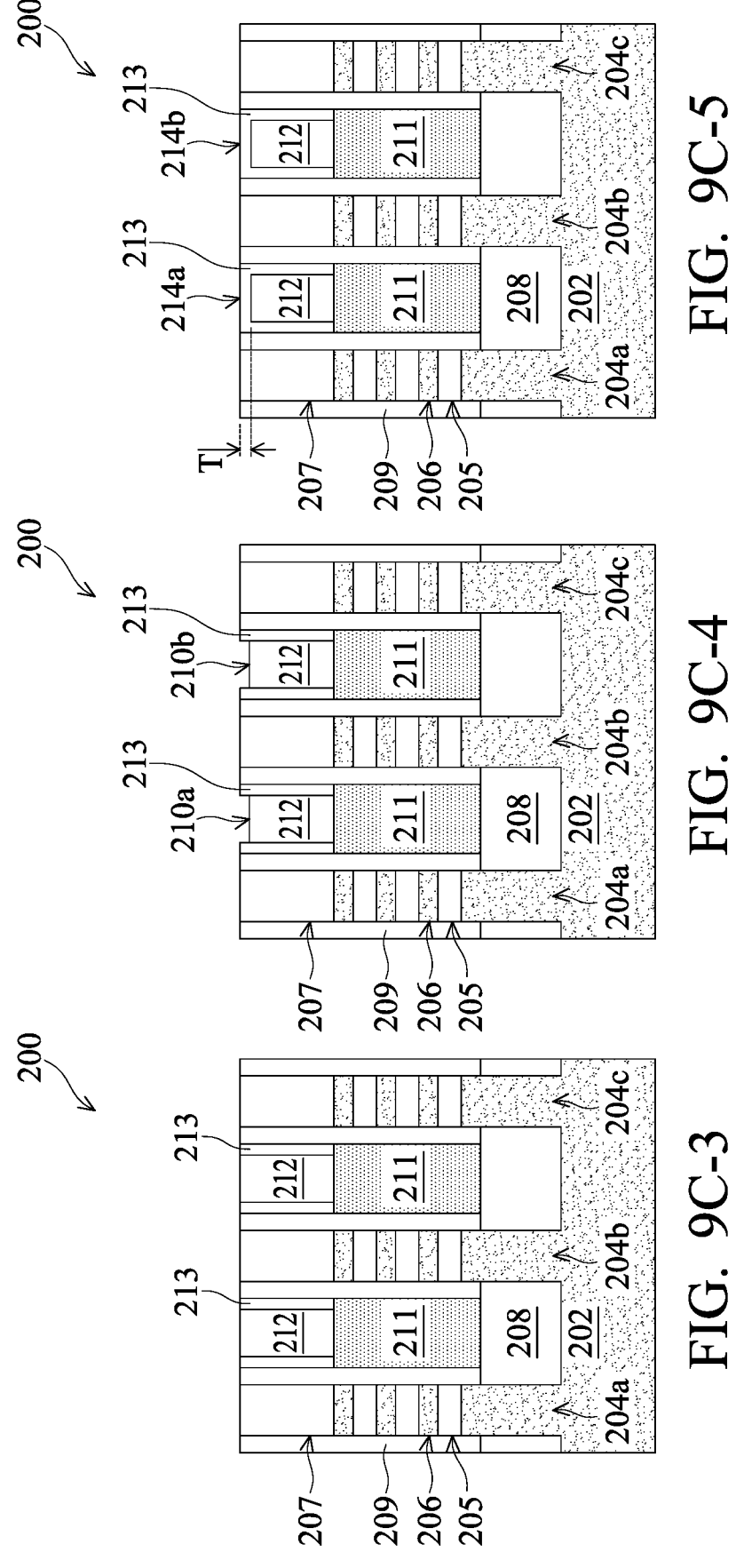

In some embodiments, referring to FIGS. 1E and 9C-1, method 420 at operation 422 conformally forms the dielectric layer 213 in the trenches 210a and 210b in a process similar to that depicted in FIG. 9B-1. Referring to FIG. 9C-2, method 420 then performs a directional (e.g., anisotropic) dry etching process to remove a portion of the dielectric layer 213 formed on the bottom surfaces of the trenches 210a and 210b without removing, or substantially removing, portions of the dielectric layer 213 formed on the sidewalls of the trenches. Referring to FIG. 9C-3, method 420 at operation 424 deposits the dielectric layer 212 to fill the trenches 210a and 210b, such that the dielectric layer 212 directly contacts the underlying dielectric layer 211. Method 420 may then perform a CMP process to remove any excess dielectric layer 212 from the hard mask layer 207. Subsequently, referring to FIG. 9C-4, method 420 at operation 426 selectively recesses portions of the dielectric layer 212 with respect to the dielectric layer 213 in a process similar to that depicted in FIG. 9B-3. Referring to FIG. 9C-5, method 420 at operation 428 fills the re-exposed trenches 210a and 210b with the dielectric layer 213 in a process similar to that depicted in FIG. 9B-4, thereby forming the isolation features 214a and 214b. Accordingly, the dielectric layer 212 is partially surrounded by the dielectric layer 213, where a bottom surface of the dielectric layer 212 directly contacts the underlying dielectric layer 211.

Figures 2, 9D:
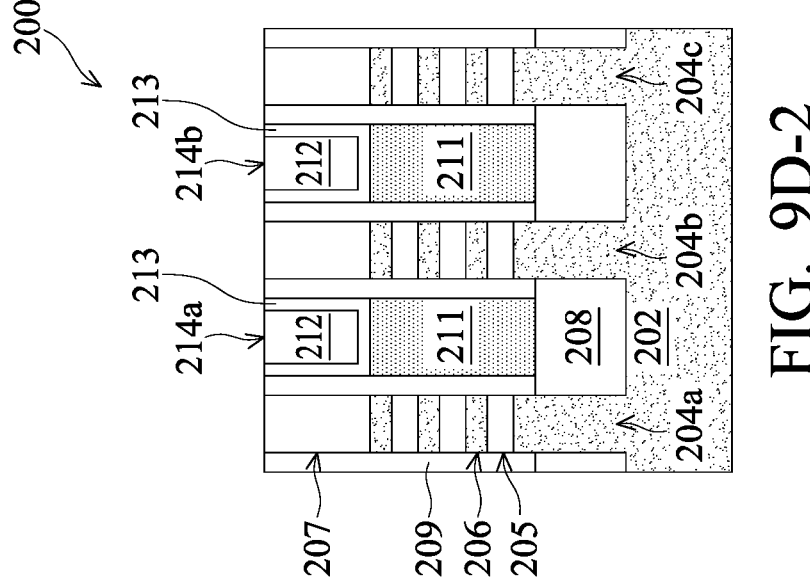
Figures 1, 9D:
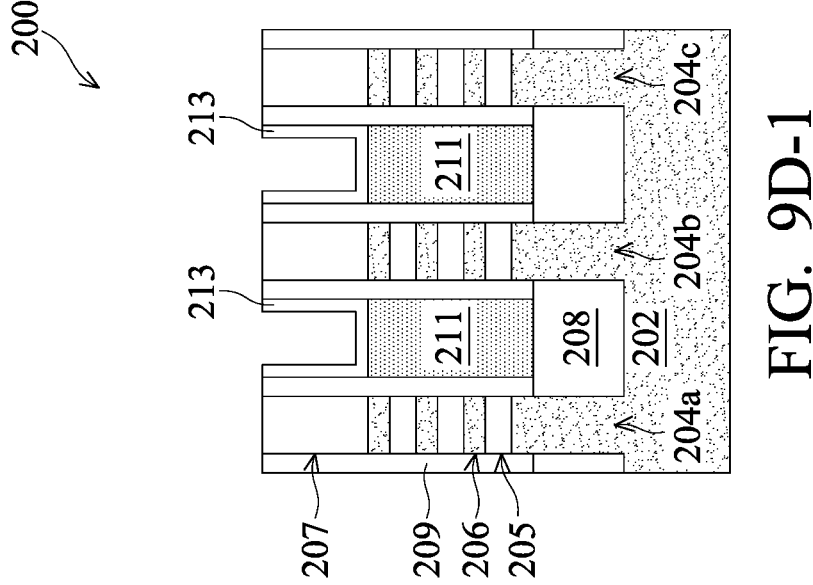

In some embodiments, referring to FIGS. 1F and 9D-1, method 430 at operation 432 conformally deposits the dielectric layer 213 on sidewalls and the bottom surfaces of the trenches 210a and 210b in a process similar to that depicted in FIG. 9B-1, and subsequently performs a CMP process to remove portions of the dielectric layer 213 formed over the hard mask layer 207. Referring to FIG. 9D-2, method 430 at operation 434 deposits the dielectric layer 212 over the dielectric layer 213 to fill the trenches 210a and 210B. Method 430 may further perform a CMP process to expose the hard mask layer 207, thereby forming the isolation features 214a and 214b. Accordingly, the dielectric layer 212 is partially surrounded by the dielectric layer 213, where a top surface of the dielectric layer 212 is exposed.

Figure 10B:
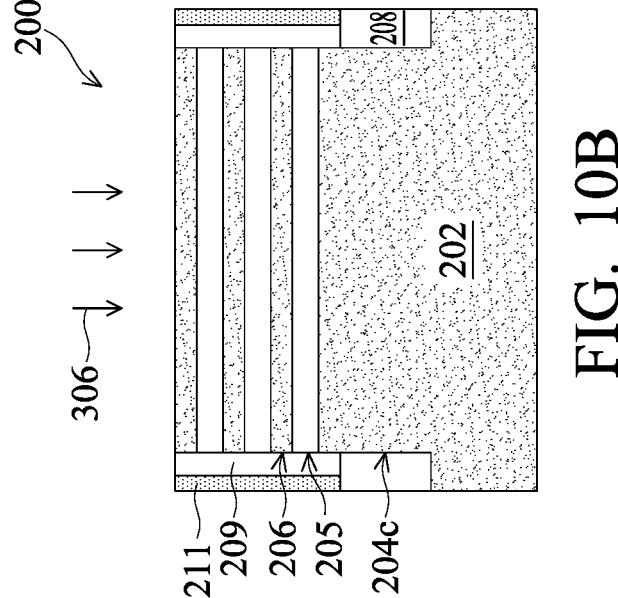
Figure 10A:
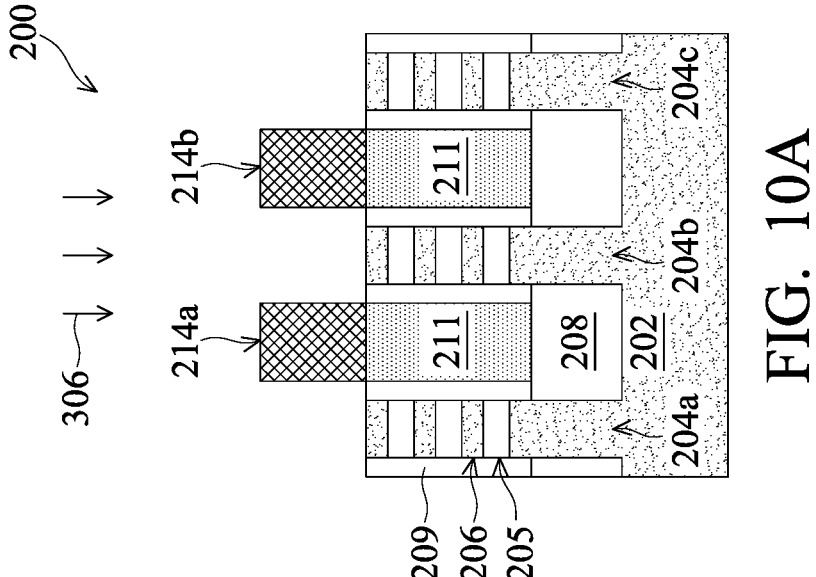

Now referring to FIGS. 10A and 10B, method 100 at operation 110 subsequently removes the hard mask layer 207 from the device 200 in an etching process 306, thereby exposing the topmost channel layer 206 of the ML. As such, the isolation features 214a and 214b protrude from top surfaces of the fins 204a-204c. In the present embodiments, the etching process 306 selectively removes the hard mask layer 207 without removing, or substantially removing, the isolation feature 214a/214b or the topmost channel layer 206 of the ML.

Figures 11A, 11B, 11C:
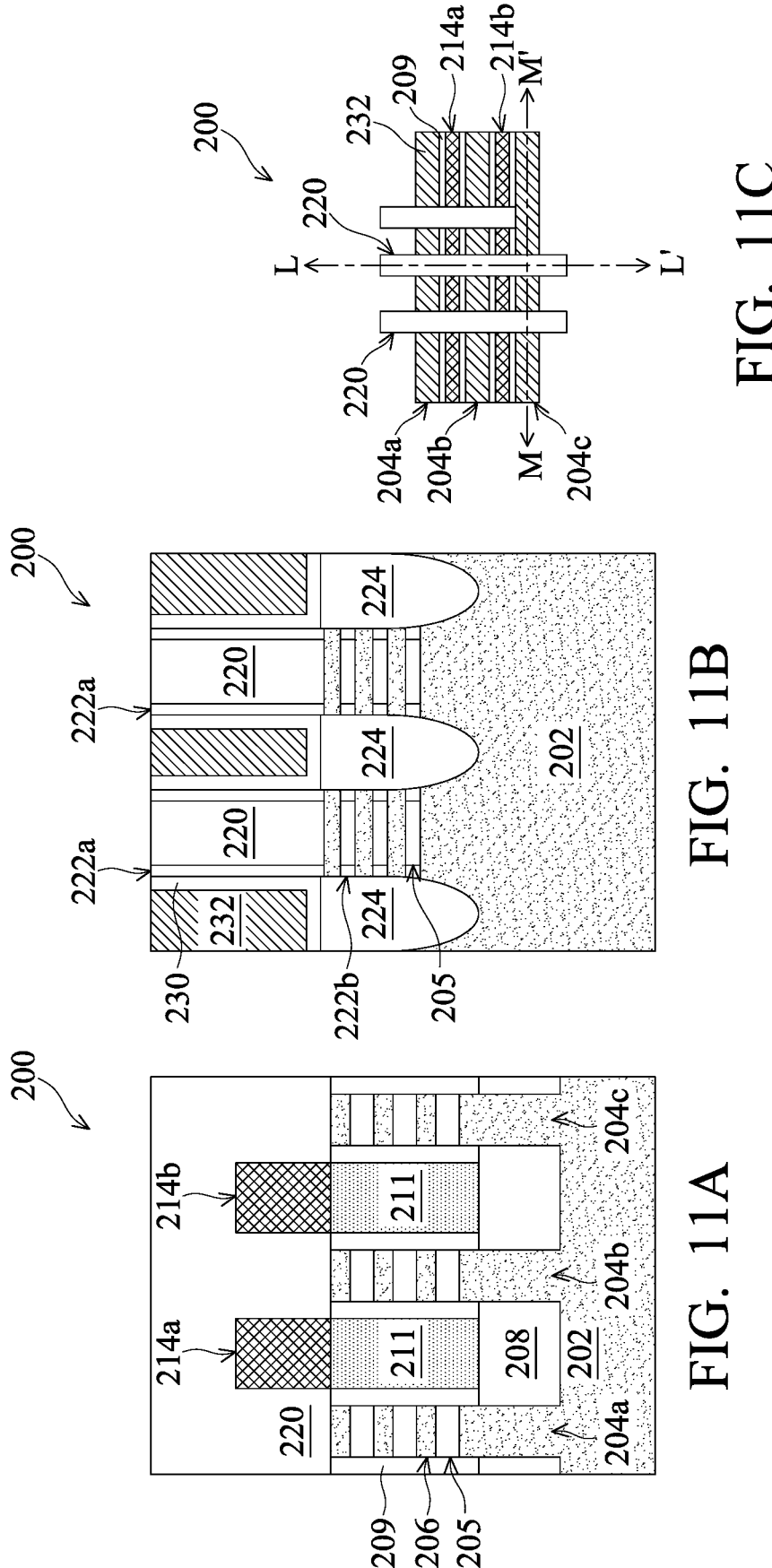

At operation 112, referring to FIGS. 11A-11C, method 100 forms dummy gate stacks 220 over channel regions of the fins 204a-204c. In the present embodiments, one or more of the dummy gate stacks 220 are formed over the isolation features 214a and 214b. Each dummy gate stack 220 may include a dummy gate electrode (not depicted separately) disposed over an optional dummy gate dielectric layer and/or an interfacial layer. In the present embodiments, at least portions of each dummy gate stack 220 are to be replaced with a metal gate stack, which also surrounds and, therefore is separated (or cut) by, one or more of the isolation features 214a and 214b.

The dummy gate stacks 220 may be formed by a series of deposition and patterning processes. For example, the dummy gate stacks 220 may be formed by depositing a polysilicon (poly-Si) layer over the fins 204a-204c separated by the isolation features 214a and 214b, and subsequently patterning the poly-Si layer via a series of photolithography and etching processes (e.g., an anisotropic dry etching process). To accommodate the patterning process and protect the dummy gate stacks 220 during subsequent fabrication processes, a hard mask layer (not depicted) may be formed over the dummy gate stacks 220.

The device 200 further includes top gate spacers 222a disposed on sidewalls of the dummy gate stacks 220. The top gate spacers 222a may be a single-layer structure or a multi-layer structure and may include silicon oxide, SiN, SiC, SiON, SiOC, SiCN, air, a low-k dielectric material, a high-k dielectric material (e.g., hafnium oxide (HfO$_2$), lanthanum oxide (La$_2$O$_3$), etc.), other suitable materials, or combinations thereof. Each spacer layer of the top gate spacers 222a may be formed by first depositing a dielectric layer over the dummy gate stacks 220 via a suitable deposition method (e.g., CVD and/or ALD) and subsequently removing portions of the dielectric layer in an anisotropic (e.g., directional) etching process (e.g., a dry etching process), leaving the top gate spacers 222a on the sidewalls of the dummy gate stacks 220.

At operation 114, still referring to FIGS. 11A-11C, method 100 forms epitaxial S/D features 224 in portions of the fins 204a-204c adjacent to the dummy gate stacks 220. In the present embodiments, forming the epitaxial S/D features 224 includes first forming S/D recesses (not depicted) in the S/D regions of the fins 204a-204c (i.e., the ML), forming inner gate spacers 222b on sidewalls of the non-channel layers 205 that are exposed in the S/D recesses, and forming epitaxial S/D features 224 in the S/D recesses.

In the present embodiments, method 100 implements an etching process that selectively removes portions of the fins 204a-204c in the S/D regions without removing, or substantially removing, the dummy gate stacks 220, or the isolation features 208. In some embodiments, the etching process is a dry etching process employing a suitable etchant capable of removing Si (i.e., the channel layers 206) and SiGe (i.e., the non-channel layers 205) of the ML. In some non-limiting examples, the dry etchant may be a chlorine-containing etchant including Cl$_2$, SiCl$_4$, BCl$_3$, other chlorine-containing gas, or combinations thereof. A cleaning process may subsequently be performed to clean the S/D recesses with a hydrofluoric acid (HF) solution or other suitable solution.

The inner gate spacers 222b may be a single-layer structure or a multi-layer structure and may include silicon oxide, SiN, SiCN, SiOC, SiON, SiOCN, a low-k dielectric material, air, a high-k dielectric material, hafnium oxide (HfO$_2$), lanthanum oxide (La$_2$O$_3$), other suitable dielectric material, or combination thereof. In some embodiments, the inner gate spacers 222b have a composition different from that of the top gate spacers 222a. Forming the inner gate spacers 222b includes performing a series of etching and deposition processes. For example, forming the inner gate spacers 222b may begin with selectively removing portions of the non-channel layers 205 without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206 that are exposed in the S/D recesses, thereby forming the inner gate spacers 222b as depicted in FIG. 11B. The one or more dielectric layers may be deposited by any suitable method, such as ALD, CVD, physical vapor deposition (PVD), other suitable methods, or combinations thereof.

Each of the epitaxial S/D features 224 may be suitable for forming a p-type FET device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 222b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the epitaxial S/D features 224.

Thereafter, still referring to FIGS. 11A-11C, method 100 forms an etch-stop layer (ESL) 230 over the device 200 to protect the underlying components, such as the epitaxial S/D features 224, during subsequent fabrication processes. The ESL 230 may include any suitable dielectric material, such as SiN, SiCN, other suitable materials, or combinations thereof, and may be formed by CVD, ALD, PVD, other suitable methods, or combinations thereof. In the present embodiments, the ESL 230 provides etching selectivity with respect to its surrounding dielectric components to ensure protection against inadvertent damage to these components.

Subsequently, method 100 forms an interlayer dielectric (ILD) layer 232 over the ESL 230, thereby filling the space between adjacent dummy gate stacks 220. The ILD layer 232 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate stacks 220.

Figure 12B:
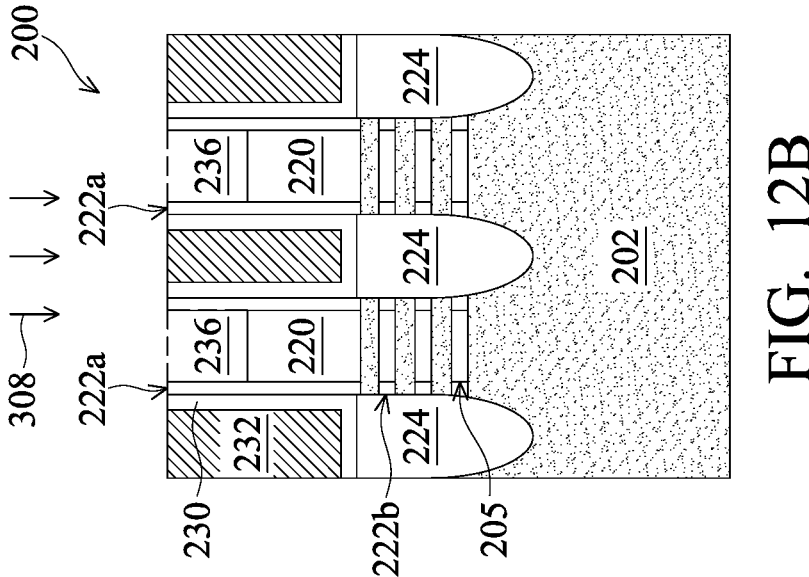
Figure 12A:
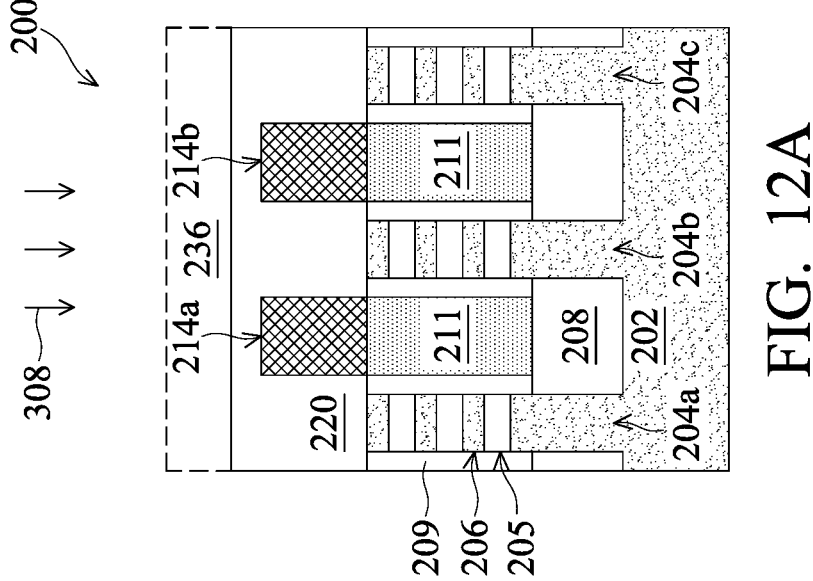

At operation 116, referring to FIGS. 12A and 12B, method 100 removes portions of the dummy gate stacks 220 in an etching process 308 to form trenches 236 between the top gate spacers 222a. The etching process 308 may include any suitable process, such as a dry etching process, a wet etching process, an RIE, or combinations thereof, configured to selectively remove the dummy gate stacks 220 without removing, or substantially removing, the top gate spacers 222a, the ESL 230, and the ILD layer 232. In some embodiments, the etching process 308 includes implementing a combination of a dry etching process and a wet etching process utilizing suitable etchants. The resulting height of the recessed dummy gate stacks 220 may be controlled by adjusting the duration of the etching process 308. In the present embodiments, the etching process 308 reduces the thickness of the portion of the dummy gate stack 220 that is disposed over the isolation features 214a and 214b, thereby assisting in the subsequent removal (by etching) of the isolation feature 214b with respect to the isolation feature 214a.

Figure 13B:
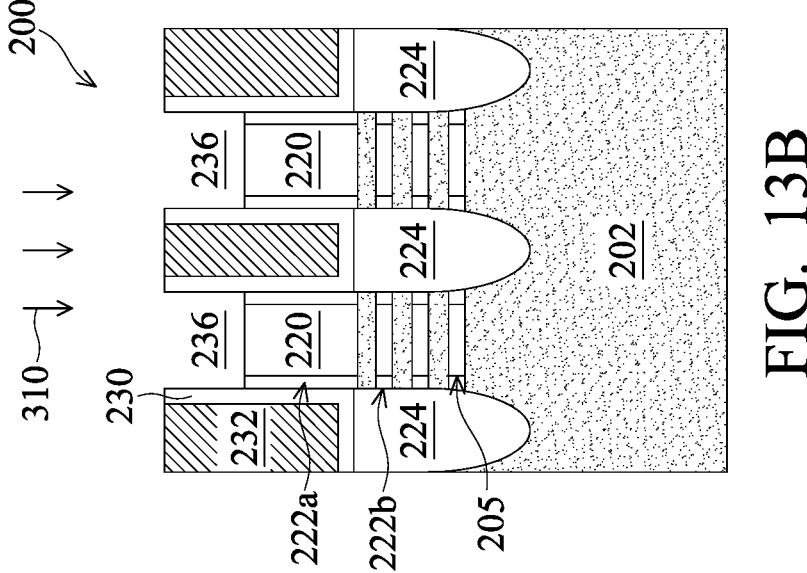
Figure 13A:
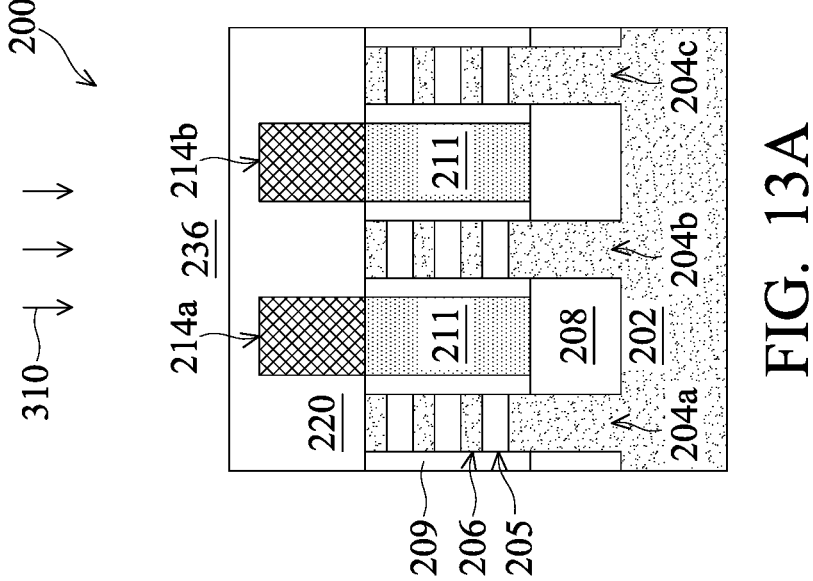

In some embodiments, as depicted in FIGS. 13A and 13B, method 100 further implements an etching process 310 to selectively remove portions of the top gate spacers 222a without removing, or substantially removing, portions of the dummy gate stacks 220, the ESL 230, and the ILD layer 232, such that the recessed dummy gate stacks 220 and the recessed top gate spacers 222a have substantially the same height. In other words, the etching process 310 widens the trenches 236 between adjacent sidewalls of the ESL 230. In the present embodiments, the etching process 310 includes any suitable process, such as a dry etching process, a wet etching process, an RIE, or combinations thereof, and implements an etchant different from that of the etching process 308 to achieve different etching selectivity. Similar to recessing the dummy gate stacks 220, the resulting height of the recessed top gate spacers 222a may be controlled by adjusting the duration of the etching process 310.

Figures 14A, 14B, 14C:
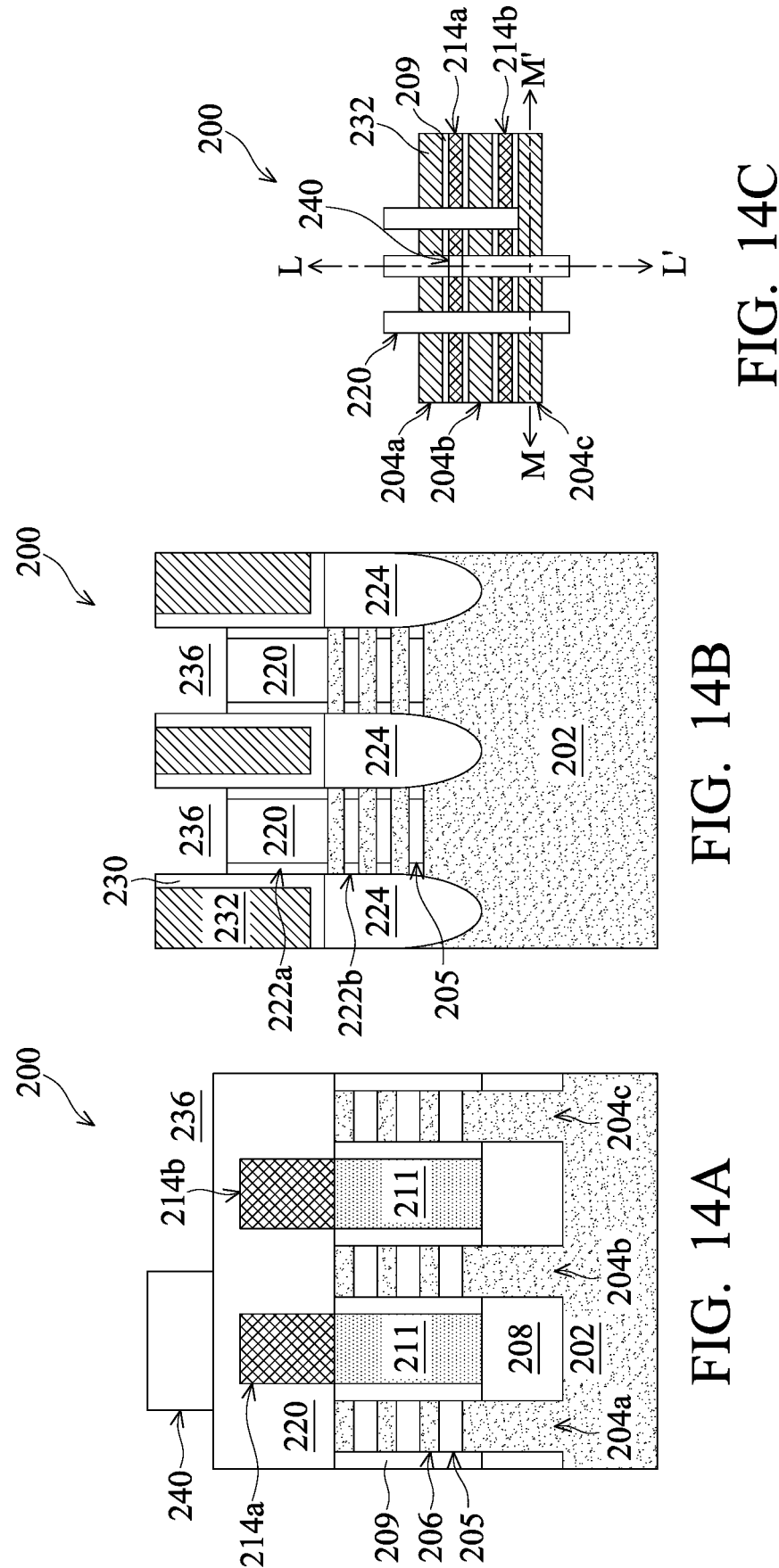

At operation 118, referring to FIGS. 14A-14C, method 100 forms a patterned masking element 240 over a portion of the dummy gate stack 220 that is engaged with (or surrounds) the portion of the isolation feature 214a between the fins 204a and 204b. In other words, the patterned masking element 240 protects a portion of the dummy gate stack 220 (and the underlying portion of the isolation feature 214a) from being etched when removing the isolation feature 214b. The patterned masking element 240 includes at least a photoresist layer (not depicted separately) capable of being patterned by a series of photolithography and etching processes discussed in detail above with respect to patterning the fins 204a-204c. The present embodiments do not limit the dimension of the patterned masking element 240, so long as it completely covers the portion of the isolation feature 214a between the fins 204a and 204b, which is to remain and become a gate isolation feature for the subsequently-formed metal gate stack, and exposes the isolation feature 214b, which is to be removed, thereby allowing the subsequently-formed metal gate stack to be in contact with the underlying dielectric layer 211. In other words, the isolation feature 214a is configured to separate the subsequently-formed metal gate stack from the underlying dielectric layer 211.

Figures 15A, 15B, 15C:
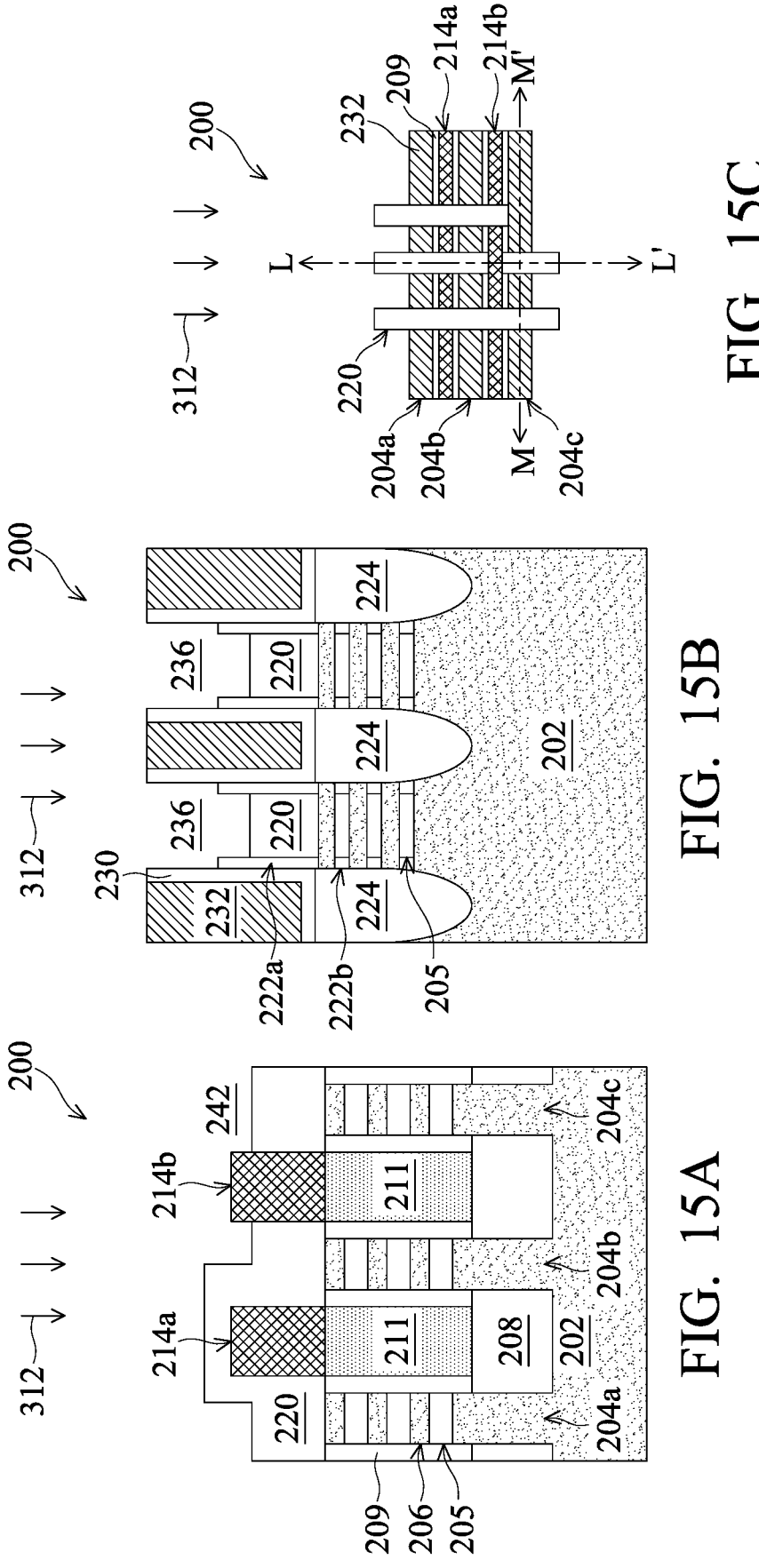

At operation 120, referring to FIGS. 15A-15C, method 100 removes portions of the dummy gate stack 220 exposed by the patterned masking element 240 in an etching process 312, thereby exposing at least a portion of the isolation feature 214b disposed between the fins 204b and 204c in a trench 242. In other words, the etching process 312 deepens portions of the trenches 236 that are not covered by the patterned masking element 240. In the present embodiments, the etching process 312 includes any suitable process, such as a dry etching process, a wet etching process, an RIE, or combinations thereof, configured to selectively remove the dummy gate stacks 220 without removing, or substantially removing, the top gate spacers 222a, the ESL 230, and the ILD layer 232. In some embodiments, the etching process 312 implements an etchant similar to that of the etching process 308. In the present embodiments, the etching process 312 needs not to completely remove the exposed portions of the dummy gate stack 220, and the extent of such removal is controlled by adjusting the duration of the etching process 312. After implementing the etching process 312, the patterned masking element 240 is removed from the device 200 by any suitable method, such as resist stripping and/or plasma ashing.

Figures 16A, 16B, 16C:
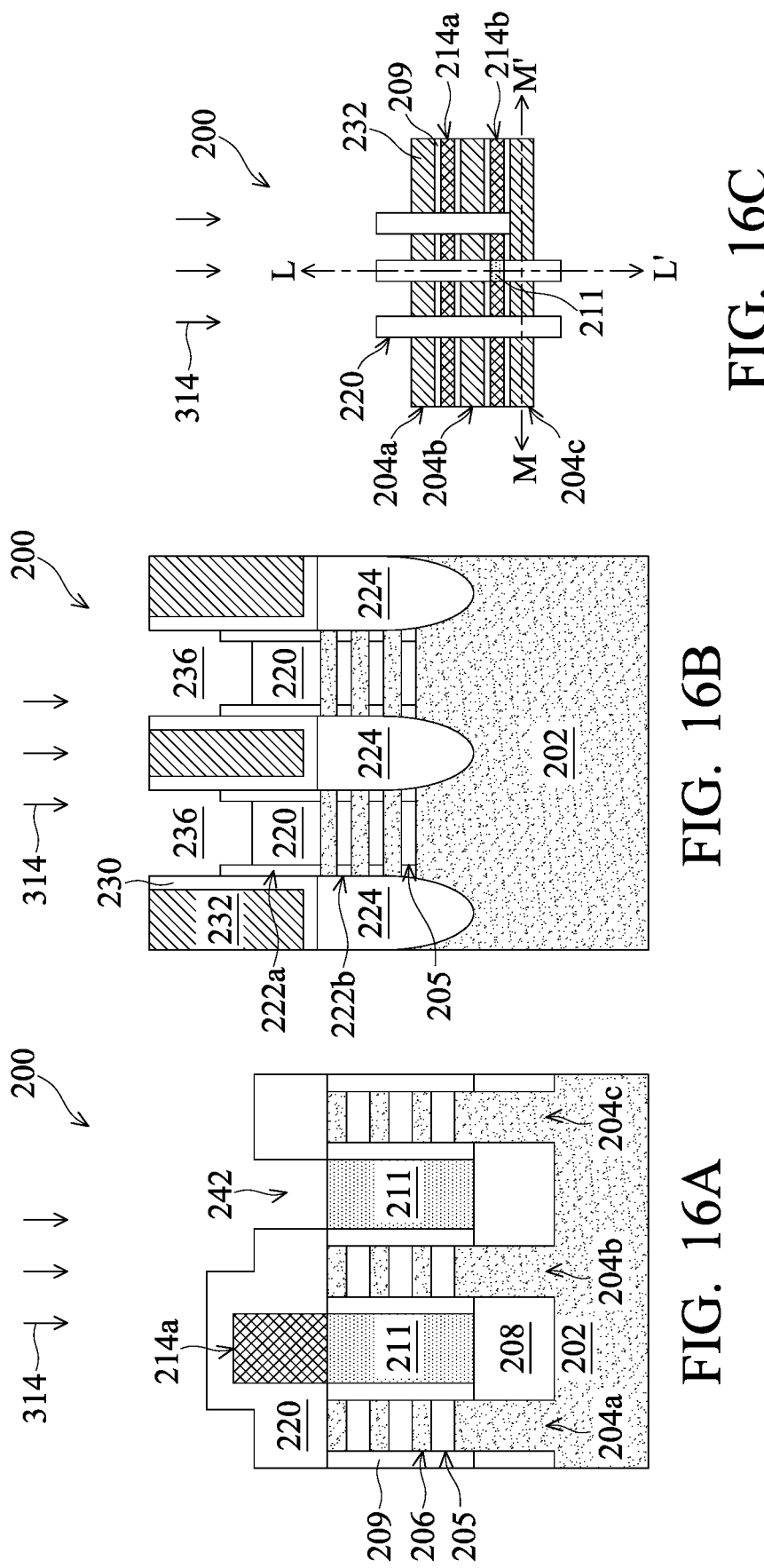

At operation 122, referring to FIGS. 16A-16C, method 100 removes the exposed portion of the isolation feature 214b in an etching process 314 to expose a portion of the dielectric layer 211 in the trench 242. Due to the patterning/etching process at operation 120, the dummy gate stack 220 protects the isolation feature 214a from being recessed by the etching process 314. In the present embodiments, the etching process is configured to selectively remove the dielectric layers 212 and 213 without removing, or substantially removing, the dummy gate stacks 220, the dielectric layer 211, the top gate spacers 222a, the ESL 230, and the ILD layer 232. The etching process 314 may include any suitable process, such as a dry etching process, a wet etching process, an RIE, or combinations thereof. In some embodiments, the etching process 314 implements multiple etching processes targeting the dielectric layers 212 and 213 separately, according to their respective composition. For example, the etching process 314 may include a wet etching process configured to remove the dielectric layer 212 and a subsequent wet etching process configured to remove the dielectric layer 213.

Figures 17A, 17B, 17C:
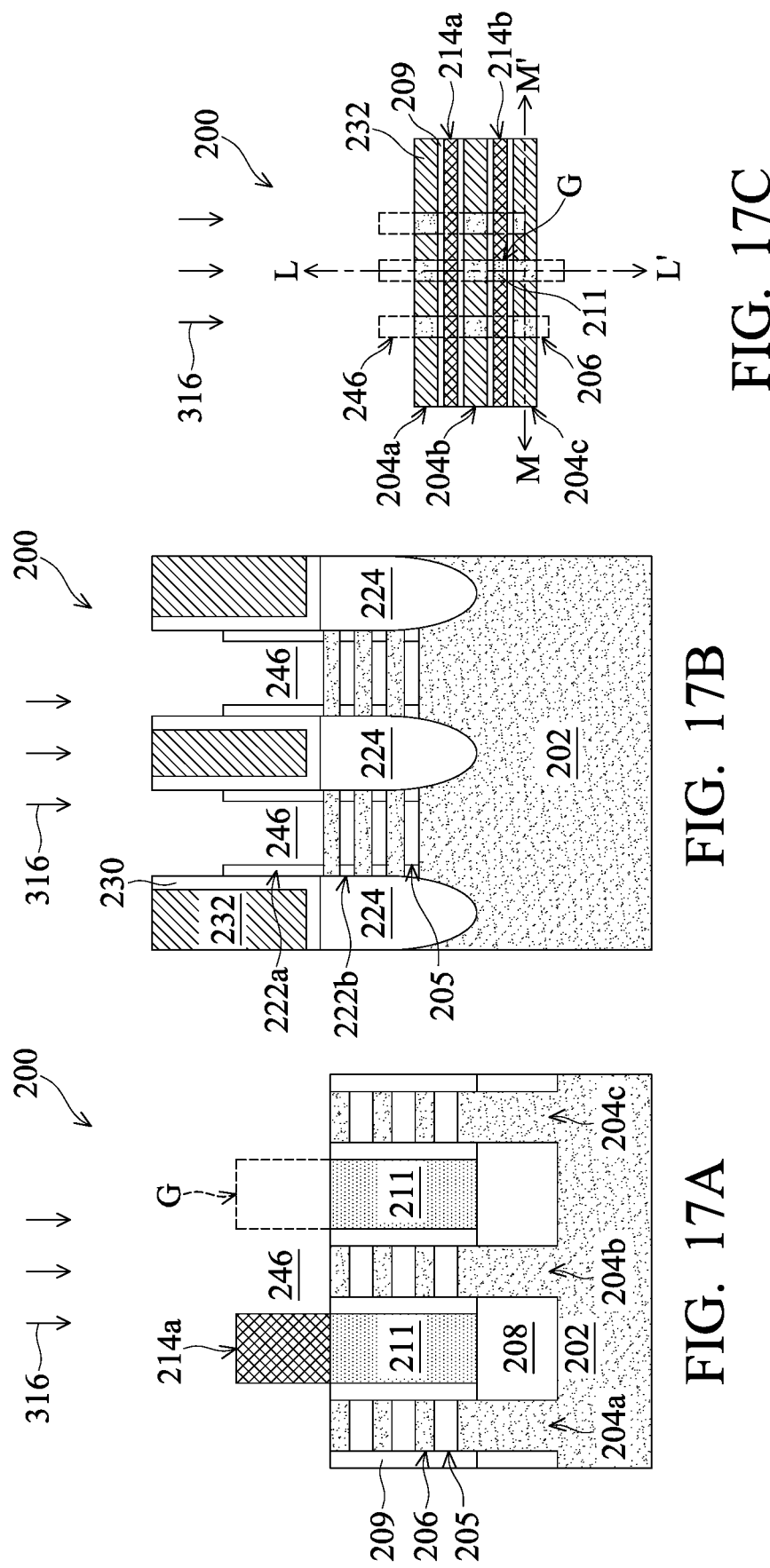

At operation 124, referring to FIGS. 17A-17C, method 100 removes the remaining portions of the dummy gate stacks 220 from the device 200 in an etching process 316 to form gate trenches 246. In the present embodiments, the etching process 316 selectively removes the dummy gate stacks 220 without removing, or substantially removing, the channel layers 206, the isolation feature 214a, the remaining portions of the isolation feature 214b, the dielectric layer 211, the top gate spacers 222a, the ESL 230, and the ILD layer 232. The etching process 316 may include any suitable process, such as a dry etching process, a wet etching process, an RIE, or combinations thereof. In some embodiments, the etching process 316 implements an etchant similar to that of the etching process 308. Referring to FIGS. 17A and 17C and for illustration purposes, a region G defined by dashed lines depicts the portion of the isolation feature 214b removed at operation 124.

Figures 18A, 18B, 18C:
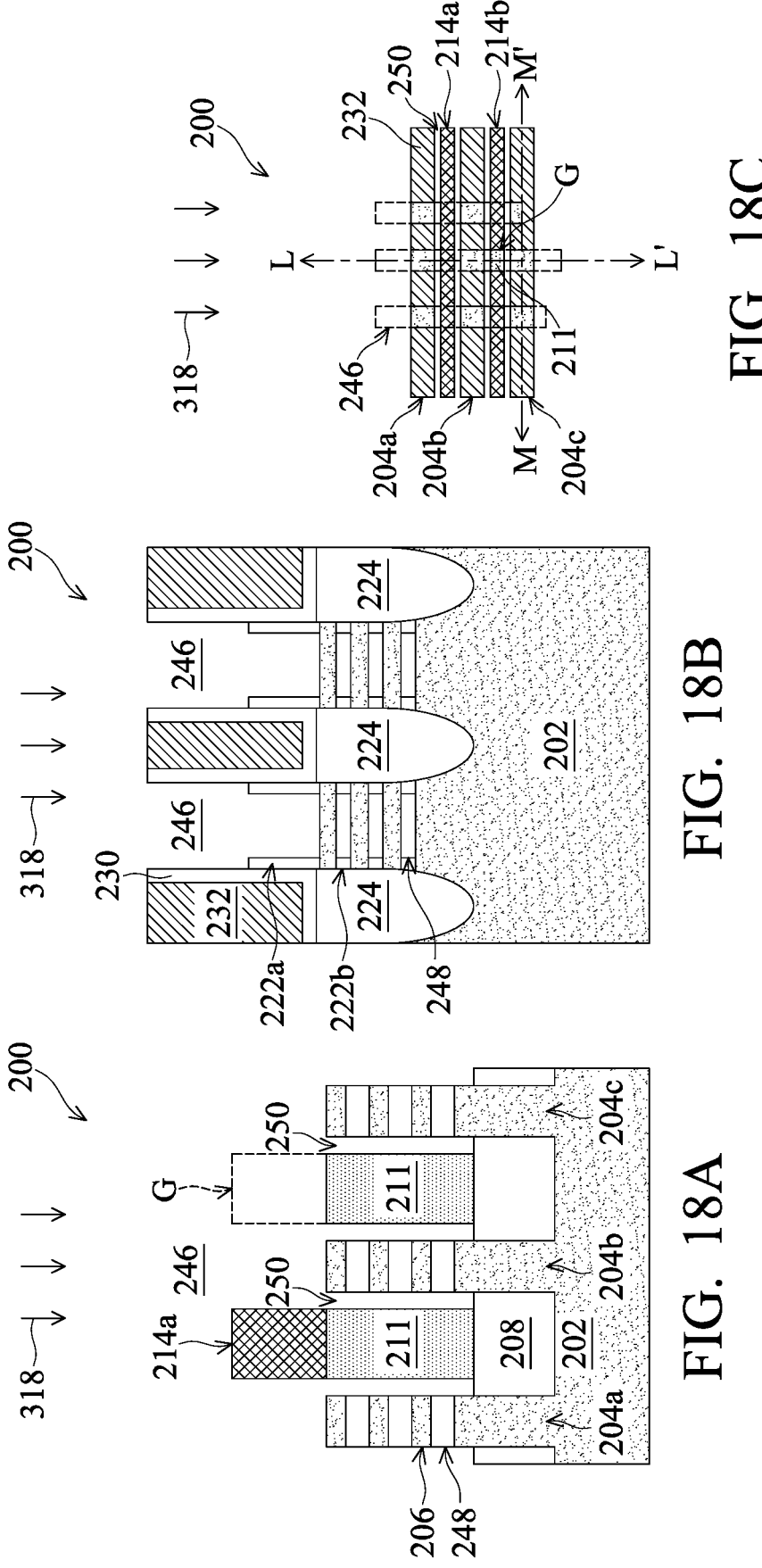

At operation 126, referring to FIGS. 18A-18C, method 100 removes the non-channel layers 205 from the ML to form openings 248 between the channel layers 206 in a sheet formation, or sheet release, process 318. In the present embodiments, the sheet formation process 318 further removes the cladding layer 209, which has a composition similar to or the same as that of the non-channel layers 205, to form trenches 250 along the sidewalls of the fins 204a-204c. The sheet formation process 318 is configured to selectively removes the non-channel layers 205 and the cladding layer 209 without removing, or substantially removing, the channel layers 206 or any other surrounding components of the device 200. In other words, the openings 248 are interleaved with the channel layers 206. In some embodiments, the sheet formation process 318 is implemented in a series of etching and trimming processes. In one example, a wet etching process employing an oxidant (or oxidizer) such as ozone ($O3$; dissolved in water), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof may be performed to selectively remove the non-channel layers 205.

Figures 19A, 19B, 19C:
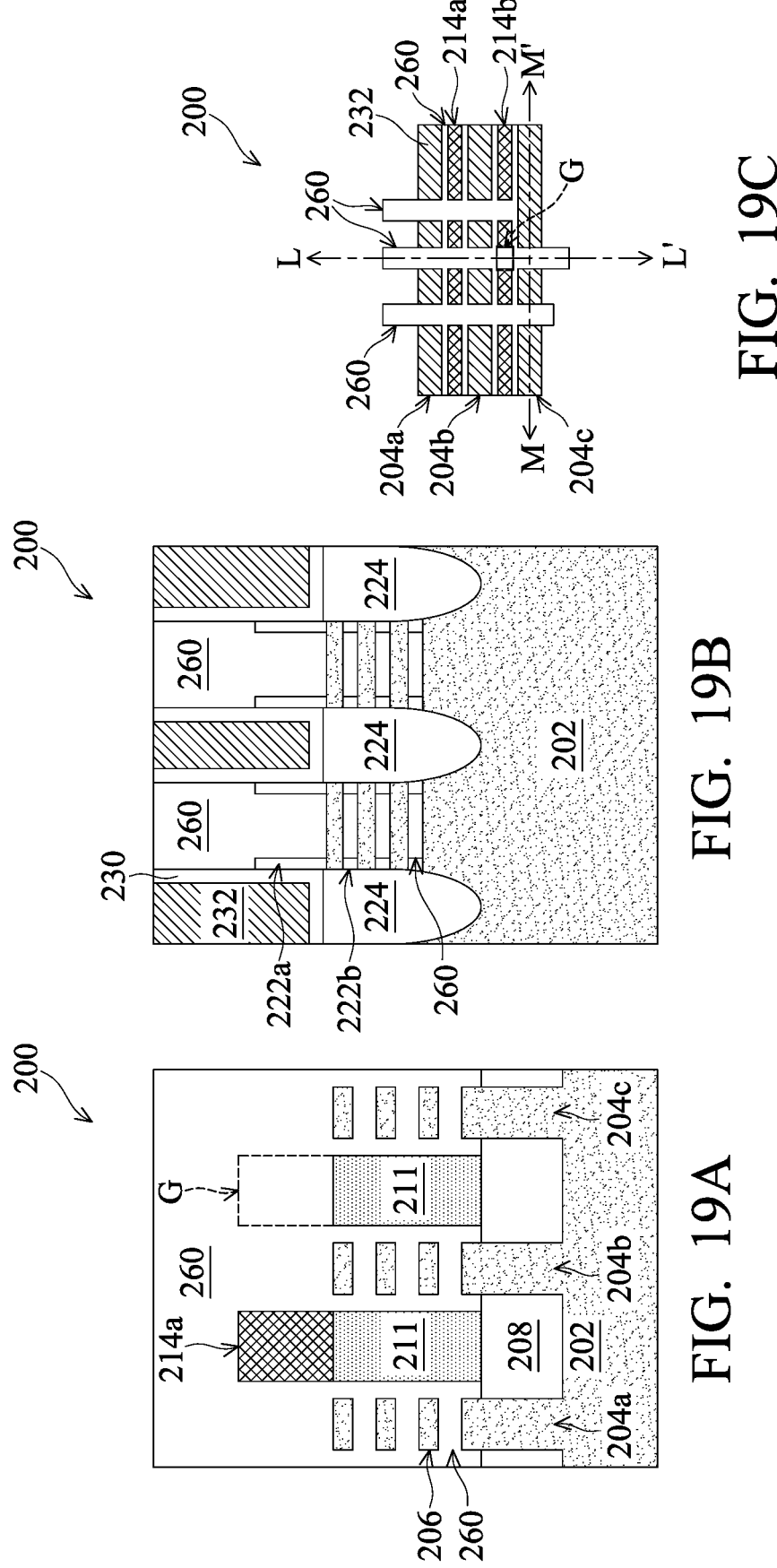

At operation 128, referring to FIGS. 19A-19C, method 100 forms a metal gate stack 260 in the gate trenches 246, the openings 248, and the trenches 250, such that the metal gate stack 260 contacts the sidewalls of the fins 204a-204c and wraps around (or interleaved with) each channel layer 206. In the present embodiments, the isolation feature 214a is embedded in the metal gate stack 260, such that the isolation feature 214a separates a top surface of the dielectric layer 211 from the metal gate stack 260, while sidewalls of the dielectric layer 211 directly contact the metal gate stack 260.

In the present embodiments, the metal gate stack 260 includes a gate dielectric layer (not depicted separately) and a metal gate electrode (not depicted separately) over the gate dielectric layer. The gate dielectric layer may include a high-k dielectric material, such as $HfO_2$, $La_2O_3$, other suitable materials, or combinations thereof. The metal gate electrode includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The metal gate stack 260 may further include other material layers (not depicted), such as an interfacial layer disposed on surfaces of the channel layers 206, a capping layer, a barrier layer, other suitable layers, or combinations thereof. Various layers of the metal gate stack 260 may be formed by various methods, including ALD, CVD, PVD, plating, other suitable methods, or combinations thereof. After forming the bulk conductive layer, one or more CMP processes are performed to remove excessive material formed on top surface of the ILD layer 232, thereby planarizing the device 200.

Figures 20A, 20B, 20C:
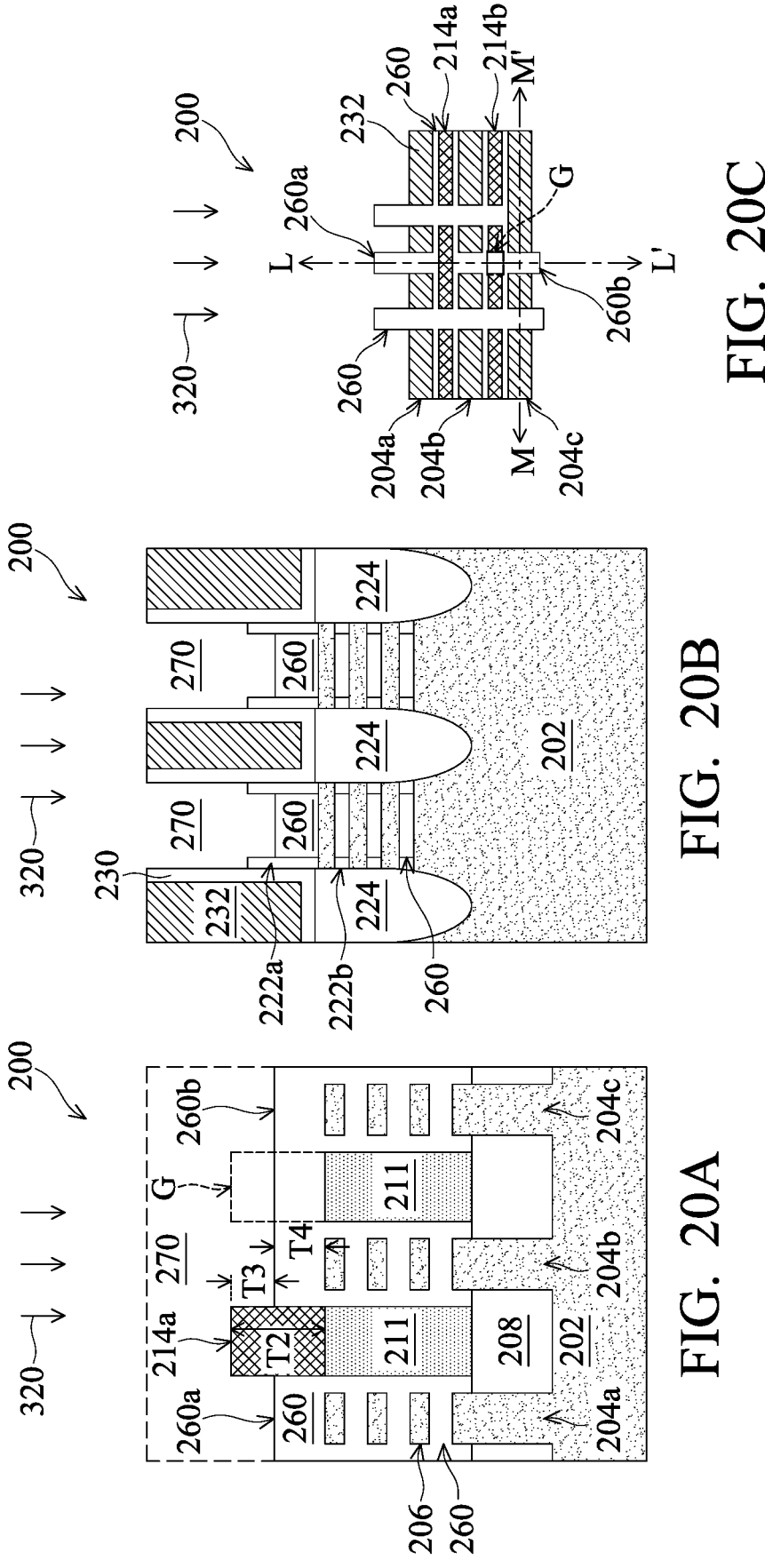

At operation 130, referring to FIGS. 20A-20C, method 100 recesses the metal gate stack 260 in an etching process 320, thereby exposing the isolation feature 214a in a trench 270. In the present embodiments, the etching process 320 selectively removes the top portion of the metal gate stack 260, including at least portions of the gate dielectric layer and the metal gate electrode, without removing, or substantially removing, the isolation feature 214a or other dielectric components nearby (e.g., the top gate spacers 222a, the ESL 230, and the ILD layer 232). The etching process 320 may be implemented by any suitable method, including a dry etching process, a wet etching process, RIE, other suitable methods, or combinations thereof, utilizing one or more etchant configured to etch components of the metal gate stack 260.

In the present embodiments, the etching process 320 is controlled to recess the metal gate stack 260 such that a top surface of the recessed metal gate stack 260 is below a top surface of the isolation feature 214a. In other words, the isolation feature 214a protrudes from the top surface of the recessed metal gate stack 260, thereby separating the metal gate stack 260 into two portions, 260a and 260b. In the depicted embodiment, referring to FIG. 20A, a height of the isolation feature 214a is defined by T2, a separation distance between the top surface of the recessed metal gate stack 260 and the top surface of the isolation feature 214a is defined by a depth T3, and a height of the portion of the metal gate stack 260 over the ML (i.e., the topmost channel layer 206) is defined by a depth T4, where T2 is the sum of T3 and T4. In the present embodiments, the etching process 320 is controlled such that T3 and T4 are both greater than zero, indicating that the trench 270 does not fully expose sidewalls of the isolation feature 214a and that a portion of the metal gate stack 260 (i.e., portions 260a and 260b) remains over the ML. In the present embodiments, a ratio of T2 to T4 must be greater than about 1 to ensure that the isolation feature 214a protrudes from the metal gate stack 260. If the ratio of T2 to T4 is less than about 1, the metal gate stack 260 would not be properly truncated into the portions 260A and 260B. In some examples, the ratio of T2 to T4 may be about 2. It is noted that the present embodiments do not limit the maximum ratio of T2 to T4 so long as it is suitable for the desired design requirement, e.g., it may be desirable to design T2 according to a thickness of the subsequently formed dielectric layer 272. In the present embodiments, the amount of the metal gate stack 260 removed (e.g., corresponding to the depth T3) is controlled by tuning one or more parameters, such as etching duration, of the etching process 320, where a longer etching duration increases the depth T3. Furthermore, in some embodiments, referring to FIG. 20B, performing the etching process 320 results in the top surface of the metal gate stack 260 to be lower than a top surface of the top gate spacers 222a.

Figures 21A, 21B, 21C:
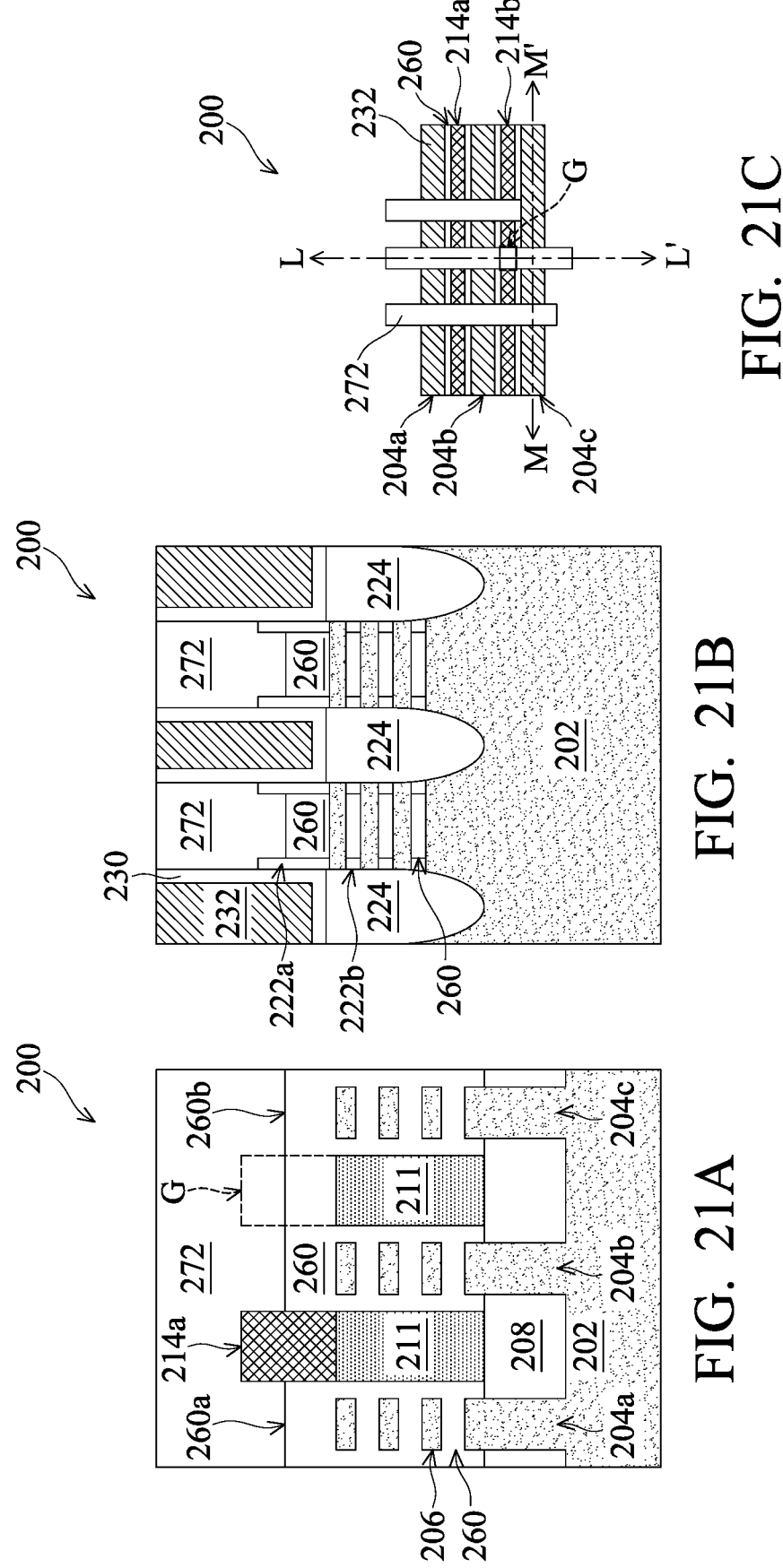
Figure 22B:
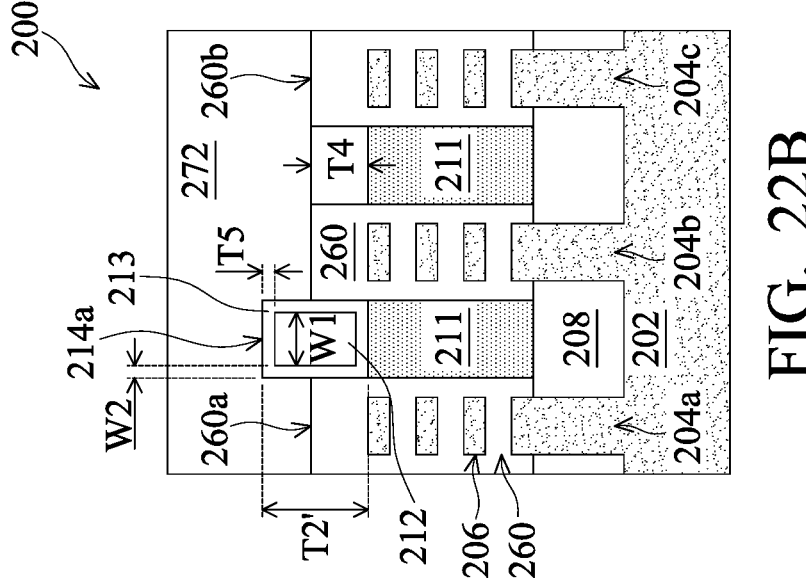
Figure 22A:
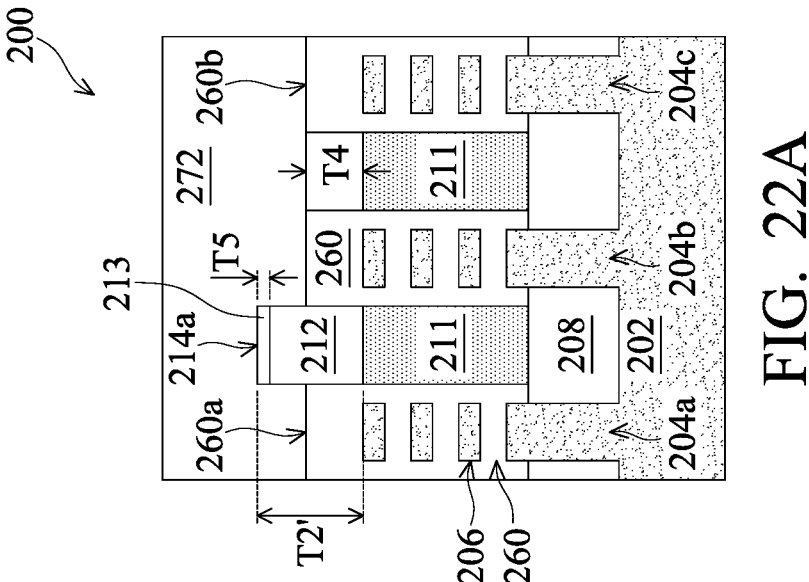
Figure 22D:
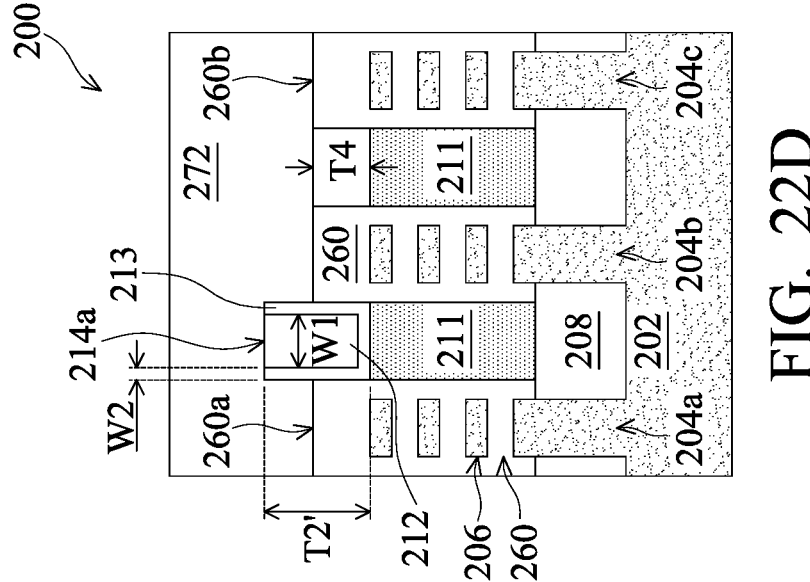
Figure 22C:
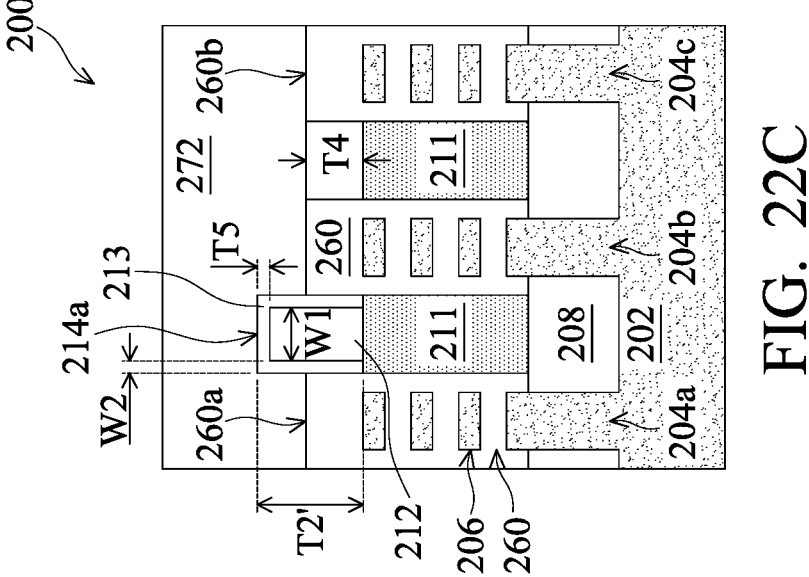

At operation 130, referring to FIGS. 21A-21C, method 100 deposits a dielectric layer 272 over the device 200, thereby filling the trench 270. In the present embodiments, the dielectric layer 272 is configured to provide self-alignment capability and etching selectivity during subsequent fabrication processes including, for example, patterning the ILD layer 232 to form S/D contact openings over the epitaxial S/D features 224. Accordingly, in the present embodiments, the dielectric layer 272 has a composition different from that of the ILD layer 232. In some embodiments, the dielectric layer 272 includes SiN, SiCN, SiOC, SiON, SiOCN, other suitable materials, or combinations thereof. The dielectric layer 272 may be deposited by any suitable method, such as ALD, CVD, PVD, other suitable methods, or combinations thereof. Subsequently, method 100 removes portions of the dielectric layer 272 formed over the ILD layer 232 in one or more CMP process, thereby planarizing the top surface of the device 200.

FIGS. 22A, 22B, 22C, and 22D illustrate example embodiments of the device 200 according to various configurations of the isolation feature 214a as depicted in FIGS. 9A-3, 9B-4, 9C-5, and 9D-2, respectively. As depicted herein, after performing operation 130, a top portion of the isolation feature 214a is embedded in the dielectric layer 272, while a bottom portion of the isolation feature 214a is embedded in the metal gate stack 260. In some embodiments, performing various etching processes, such as the etching processes 314 and/or 320, inadvertently removes top and/or sidewall portions of the isolation feature 214a, thereby reducing the height T2 to T2'. In some embodiments, referring to FIGS. 22A-22C, a thickness T5 of a portion of the dielectric layer 213 disposed over the dielectric layer 212 is reduced (compared to thickness T depicted in FIGS. 9A-3, 9B-4, and 9C-5, respectively) after performing various operations of method 100. In some embodiments, T5 is reduced to less than about 1 nm. For example, T5 may be greater than about 0 nm and less than about 1 nm. In some instances, T5 may be reduced to 0 nm, i.e., the dielectric layer 213 is completely removed. It is noted that such reduction in the thickness (i.e., volume) of the dielectric layer 213 does not significantly affect the overall dimension of the device 200. For example, a ratio of T2' to T4 remains greater than about 1 to about 2 to ensure that the top surface of the isolation feature 214a is above the top surface of the metal gate stack 260. In the present embodiments, reduction in T5 further reduces the parasitic capacitance of the isolation feature 214a, thus improving the overall performance of the device 200. Furthermore, as discussed in detail above, the volume of the dielectric layer 213 remains less than that of the dielectric layer 212. For example, still referring to FIGS. 22B-22D, a width W1 of the dielectric layer 212 is greater than a width W2 of the dielectric layer 213.

Thereafter, method 100 at operation 132 performs additional fabrication processes to the device 200, such as forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact (not depicted) or a gate contact (not depicted), with a conductive line or interconnect different conductive lines, which are horizontal interconnect features. The ESLs and the ILD layers of the MLI may have substantially same compositions as those discussed above with respect to the ESL 230 and the ILD layer 232, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides a gate isolation feature, and methods of forming the same, disposed between two active device regions and configured to include dielectric materials having different k values: a first dielectric material having a relatively lower k value and a second dielectric material having a relatively higher k value. In some embodiments, the composition of the gate isolation feature is configured such that the volume of the first dielectric material is greater than the volume of the second dielectric material. In the present embodiments, besides offering scaling capability to accommodate fabrication of devices at advanced technology nodes, the gate isolation feature configured with dissimilar dielectric materials allows reduction of the parasitic capacitance between adjacent active regions (e.g., fin active regions) as well as resistance against potential etching damage, thereby improving the overall performance of the devices. Embodiments of the disclosed methods can be readily integrated into existing processes and technologies for manufacturing NS FETs, FinFETs, and/or other suitable devices.

In one aspect, the present embodiments provide a semiconductor structure that includes semiconductor fins protruding from a substrate and separated by a dielectric layer, where each semiconductor fin includes a plurality of semiconductor layers, source/drain (S/D) features disposed in the semiconductor fins, a first metal gate stack and a second metal gate stack disposed over the semiconductor fins and adjacent to the S/D features, where the first and the second metal gate stacks each include a top portion and a bottom portion disposed below the top portion, and where the bottom portion is interleaved with the semiconductor layers, and an isolation feature disposed on the dielectric layer and in contact with a sidewall surface of each of the first and the second metal gate stacks, where the isolation feature protrudes from the top portion of the first and the second metal gate stack, and where the isolation feature includes two dissimilar dielectric layers.

In another aspect, the present embodiments provide a semiconductor structure that includes a first fin and a second fin protruding from a substrate, the first and the second fins each including a stack of semiconductor layers, an insulating layer filling space between the first and the second fins, a metal gate stack engaged with the first and the second fins, where a first portion of the metal gate stack is disposed over the first and the second fins and a second portion of the metal gate stack is interleaved with the stack of semiconductor layers of each of the first and the second fins, and a dielectric feature disposed on the insulating layer and extending vertically through the metal gate stack, where the dielectric feature includes two dielectric layers with different dielectric constants.

In yet another aspect, the present embodiments provide a method of forming a semiconductor structure that includes forming semiconductor fins protruding from a substrate and oriented lengthwise in a first direction, forming a first dielectric layer over the substrate to fill space between adjacent semiconductor fins, recessing the first dielectric layer to form a first trench and a second trench, and forming a first dielectric feature in the first trench and a second dielectric feature in the second trench, where the first and the second dielectric features are oriented lengthwise along the first direction and each include a second dielectric layer and a third dielectric layer having different dielectric constants. The method further includes forming a placeholder gate over the semiconductor fins, where portions of the first and the second dielectric features are embedded in the placeholder gate, selectively removing the portion of the first dielectric feature embedded in the placeholder gate without removing any portion of the second dielectric feature, removing the placeholder gate to expose the portion of the second dielectric feature in a third trench, forming a metal gate stack in the third trench, recessing the metal gate stack to expose the second dielectric feature, where a top surface of the second dielectric feature is above a top surface of the recessed metal gate stack, and forming a fourth dielectric layer over the recessed metal gate stack, such that a top portion of the second dielectric feature is embedded in the fourth dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
semiconductor fins protruding from a substrate and separated from each other by a first dielectric layer, wherein each semiconductor fin includes a protruding portion of the substrate and a plurality of semiconductor layers over the protruding portion of the substrate, wherein the first dielectric layer is disposed laterally between the plurality of semiconductor layers;
source/drain (S/D) features disposed in the semiconductor fins;
a first metal gate stack and a second metal gate stack disposed over the semiconductor fins and adjacent to the S/D features, wherein the first and the second metal gate stacks each include a top portion and a bottom portion disposed below the top portion, and wherein the bottom portion is interleaved with the semiconductor layers; and
an isolation feature disposed on a top surface of the first dielectric layer and in contact with a sidewall surface of each of the first and the second metal gate stacks, wherein the isolation feature protrudes from the top portion of the first and the second metal gate stack, and wherein the isolation feature includes a second dielectric layer and a third dielectric layer that differs from the second dielectric layer in composition.

2. The semiconductor structure of claim 1, wherein the second dielectric layer has a dielectric constant lower than that of the third dielectric layer.

3. The semiconductor structure of claim 2, wherein volume of the second dielectric layer is greater than that of the third dielectric layer.

4. The semiconductor structure of claim 1, wherein the third dielectric layer defines a top surface, a sidewall surface, or both surfaces of the second dielectric layer.

5. The semiconductor structure of claim 4, wherein the third dielectric layer further defines a bottom surface of the second dielectric layer.

6. The semiconductor structure of claim 1, wherein each of the first and the second metal gate stacks further includes a sidewall portion disposed between a sidewall of each semiconductor fin and the first dielectric layer.

7. The semiconductor structure of claim 1, further comprising a fourth dielectric layer disposed over the top portion of each of the first and the second metal gate stacks, such that a top portion of the isolation feature is embedded in the fourth dielectric layer.

8. A semiconductor structure, comprising:
a first fin and a second fin protruding from a substrate, the first and the second fins each including a semiconductor stack of semiconductor layers over a bottom fin portion;
a shallow trench isolation (STI) structure filling space between the bottom fin portions of the first and the second fins;
an insulating layer above the STI structure and continuously spanning laterally between the semiconductor stacks of the first and the second fins;
a metal gate stack engaged with the first and the second fins, wherein a first portion of the metal gate stack is disposed over the first and the second fins and a second portion of the metal gate stack is interleaved with the semiconductor stack of semiconductor layers of each of the first and the second fins; and
a dielectric feature disposed on the insulating layer and extending vertically through the metal gate stack, wherein the dielectric feature has a top portion extending above a top surface of the metal gate stack, wherein the dielectric feature includes a first dielectric layer and a second dielectric layer, and wherein dielectric constant of the second dielectric layer is greater than that of the first dielectric layer.

9. The semiconductor structure of claim 8, wherein the metal gate stack further includes a third portion disposed between each of the first and the second fins and the insulating layer.

10. The semiconductor structure of claim 8, wherein volume of the first dielectric layer is greater than that of the second dielectric layer.

11. The semiconductor structure of claim 8, wherein the second dielectric layer is disposed over the first dielectric layer.

12. The semiconductor structure of claim 11, wherein the second dielectric layer encapsulates the first dielectric layer.

13. The semiconductor structure of claim 8, wherein the first dielectric layer is disposed over the second dielectric layer.

14. A semiconductor structure, comprising:
a first fin and a second fin protruding from a substrate;
an isolation structure disposed between the first fin and the second fin;
an insulating layer disposed over the isolation structure and between the first fin and the second fin;
a metal gate structure disposed over channel regions of the first and the second fins; and
a dielectric feature disposed over the insulating layer and vertically cutting through the metal gate structure,
wherein the dielectric feature includes a first dielectric layer over a second dielectric layer, the first dielectric layer has a higher dielectric constant than the second dielectric layer, and the second dielectric layer has a greater volume than the first dielectric layer,
wherein a top surface of the first dielectric layer and a top surface of the second dielectric layer are both above a topmost surface of the metal gate structure.

15. The semiconductor structure of claim 14, wherein the first dielectric layer completely surrounds the second dielectric layer.

16. The semiconductor structure of claim 14, wherein the first dielectric layer is also on sidewall surfaces of the second dielectric layer.

17. The semiconductor structure of claim 14, further comprising a third dielectric layer disposed over the dielectric feature and over the metal gate structure, wherein a top portion of the dielectric feature is embedded in the third dielectric layer.

18. The semiconductor structure of claim 14, wherein the first dielectric layer includes hafnium oxide, wherein the second dielectric layer includes silicon oxide, silicon nitride, oxygen-containing silicon nitride, or aluminum oxide.

19. The semiconductor structure of claim 14, wherein the first and the second fins each includes a stack of semiconductor layers, and the metal gate structure has a lower portion that wraps around the stack of semiconductor layers in each of the first and the second fins.

20. The semiconductor structure of claim 14, further comprising:

a third fin protruding from the substrate; and a second insulating layer disposed between the second fin and the third fin, wherein the metal gate structure is disposed over a channel region of the third fin and also over the second insulating layer.

\* \* \* \* \*